United States Patent
Zhang et al.

(10) Patent No.: US 12,052,870 B2
(45) Date of Patent: Jul. 30, 2024

(54) STAIRCASE STRUCTURE WITH MULTIPLE DIVISIONS FOR THREE-DIMENSIONAL MEMORY

(71) Applicant: Yangtze Memory Technologies Co., Ltd., Hubei (CN)

(72) Inventors: Zhong Zhang, Hubei (CN); Wenyu Hua, Hubei (CN); Bo Huang, Hubei (CN); Zhiliang Xia, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 291 days.

(21) Appl. No.: 17/495,252

(22) Filed: Oct. 6, 2021

(65) Prior Publication Data
US 2022/0028888 A1 Jan. 27, 2022

Related U.S. Application Data

(60) Division of application No. 16/422,434, filed on May 24, 2019, now Pat. No. 11,462,558, which is a
(Continued)

(51) Int. Cl.
*H01L 21/31* (2006.01)
*H01L 21/033* (2006.01)
(Continued)

(52) U.S. Cl.
CPC ......... *H10B 43/27* (2023.02); *H01L 21/0337* (2013.01); *H01L 21/31144* (2013.01);
(Continued)

(58) Field of Classification Search
CPC .......... H01L 29/40117; H01L 21/0337; H01L 21/31144; H10B 43/10; H10B 43/27; H10B 43/35
(Continued)

(56) References Cited

U.S. PATENT DOCUMENTS 8,530,350 B2 * 9/2013 Freeman .......... H01L 21/32139
438/666
8,697,498 B2 4/2014 Jang et al.
(Continued)

FOREIGN PATENT DOCUMENTS

CN 107039457 A 8/2017
CN 108364953 A 8/2018
(Continued)

OTHER PUBLICATIONS

International Search Report and Written Opinion of the International Searching Authority directed to related International Patent Application No. PCT/CN2019/075650, mailed Nov. 20, 2019; 9 pages.

*Primary Examiner* — Monica D Harrison
(74) *Attorney, Agent, or Firm* — Sterne, Kessler, Goldstein & Fox P.L.L.C.

(57) ABSTRACT

Embodiments of staircase structures of a three-dimensional memory device and fabrication method thereof are disclosed. The semiconductor structure includes a first and a second film stacks, wherein the first film stack is disposed over the second film stack and has $M_1$ number of layers. The second film stack has $M_2$ number of layers. $M_1$ and $M_2$ are whole numbers. The semiconductor structure also includes an upper staircase structure and a lower staircase structure, wherein the upper staircase structure is formed in the first film stack and the lower staircase structure is formed in the second film stack. The upper and lower staircase structures are next to each other with an offset.

19 Claims, 16 Drawing Sheets

Related U.S. Application Data continuation of application No. PCT/CN2019/075650, filed on Feb. 21, 2019.

(51) Int. Cl.
  *H01L 21/28* (2006.01)
  *H01L 21/311* (2006.01)
  *H01L 29/40* (2006.01)
  *H10B 43/10* (2023.01)
  *H10B 43/27* (2023.01)
  *H10B 43/35* (2023.01)

(52) U.S. Cl.
  CPC ........ *H01L 29/40117* (2019.08); *H10B 43/10* (2023.02); *H10B 43/35* (2023.02)

(58) Field of Classification Search
  USPC .......................................................... 257/324
  See application file for complete search history.

(56) References Cited

U.S. PATENT DOCUMENTS

| | | | |
|---|---|---|---|
| 9,230,987 | B2 | 1/2016 | Pachamuthu et al. |
| 10,593,690 | B2 | 3/2020 | Lu et al. |
| 2012/0068252 | A1 | 3/2012 | Katsumata et al. |
| 2013/0009274 | A1 | 1/2013 | Lee et al. |
| 2014/0191388 | A1 | 7/2014 | Chen |
| 2015/0228623 | A1 | 8/2015 | Oh et al. |
| 2016/0148835 | A1 | 5/2016 | Shimabukuro et al. |
| 2017/0256551 | A1* | 9/2017 | Lee ........................ H10B 41/40 |
| 2018/0331034 | A1 | 11/2018 | Thimmegowda et al. |
| 2018/0337192 | A1 | 11/2018 | Kim et al. |
| 2020/0273874 | A1 | 8/2020 | Zhang et al. |

FOREIGN PATENT DOCUMENTS

| | | |
|---|---|---|
| CN | 108962910 A | 12/2018 |
| CN | 109155318 A | 1/2019 |
| TW | 201834217 A | 9/2018 |

\* cited by examiner

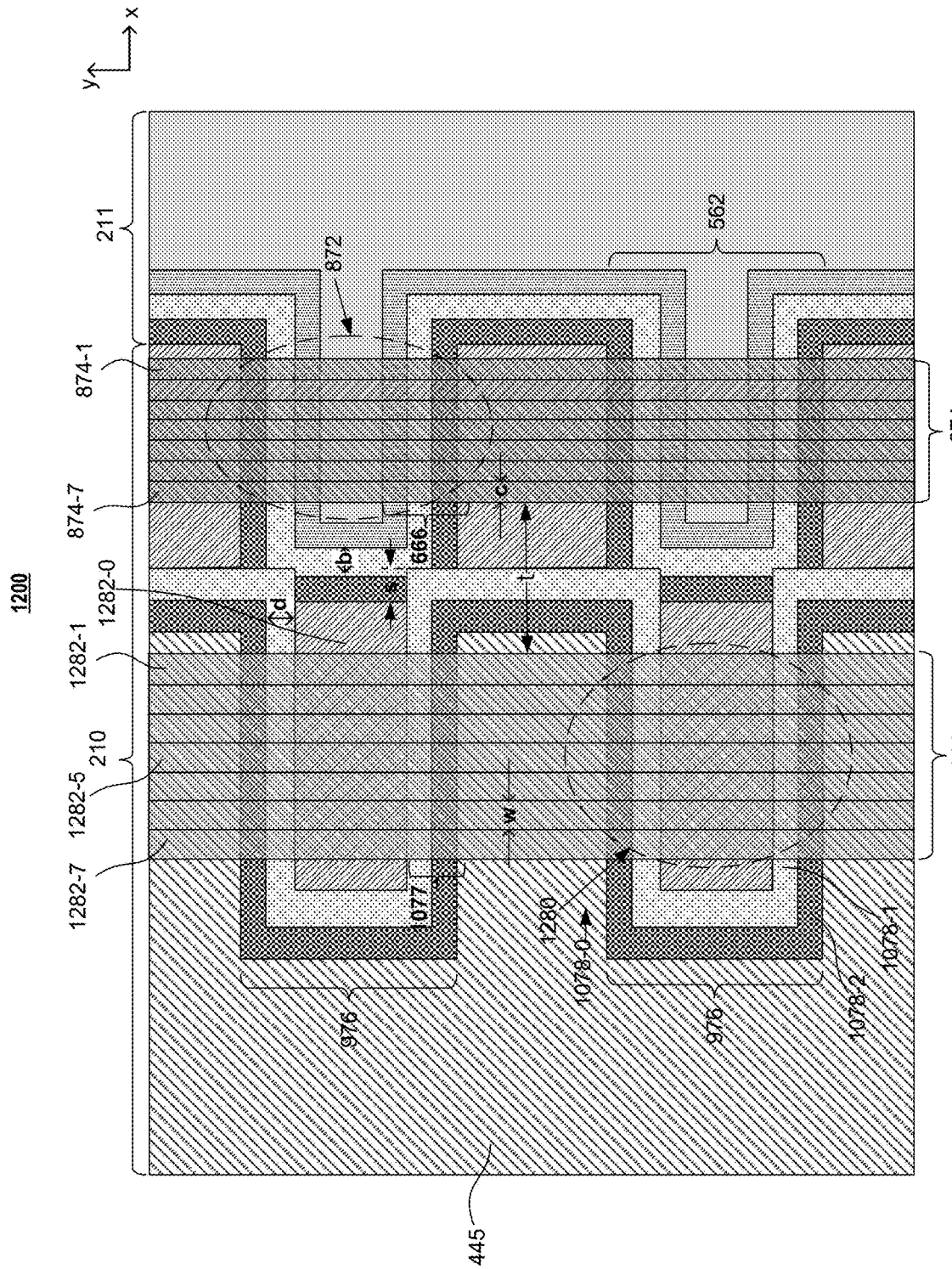

STAIRCASE STRUCTURE WITH MULTIPLE DIVISIONS FOR THREE-DIMENSIONAL MEMORY

CROSS-REFERENCE TO RELATED APPLICATIONS AND INCORPORATION BY REFERENCE

This application is a divisional of U.S. patent application Ser. No. 16/422,434, filed on May 24, 2019 and titled "Staircase Structure with Multiple Divisions for Three-Dimensional Memory," which claims priority to PCT/CN2019/075650 filed on Feb. 21, 2019, all of which are incorporated herein by reference in their entirety.

TECHNICAL FIELD

The present disclosure generally relates to the field of semiconductor technology, and more particularly, to a method for forming a three-dimensional (3D) memory.

BACKGROUND

Planar memory cells are scaled to smaller sizes by improving process technology, circuit designs, programming algorithms, and the fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

BRIEF SUMMARY

Embodiments of staircase structures for a three-dimensional memory device and methods for forming the same are described in the present disclosure.

In some embodiments, staircase structures of a three-dimensional memory device and fabrication method thereof are disclosed. The semiconductor structure includes a first and a second film stacks, wherein the first film stack is disposed over the second film stack and has $M_1$ number of layers. The second film stack has $M_2$ number of layers. $M_1$ and $M_2$ are whole numbers. The semiconductor structure also includes an upper staircase structure and a lower staircase structure, wherein the upper staircase structure is formed in the first film stack and the lower staircase structure is formed in the second film stack. The upper and lower staircase structures are next to each other with an offset.

In some embodiments, the upper staircase structure further includes $M_3$ number of steps in a first direction, and each step of the upper staircase structure in the first direction includes $M_4$ number of steps in a second direction. $M_3$ and $M_4$ are whole numbers, and the first and second directions are perpendicular to each other and are in a plane parallel to a top surface of the first film stack.

In some embodiments, each step of the upper staircase structure in the second direction includes one layer of the first film stack, and each step of the upper staircase structure in the first direction includes $M_4+1$ number of layers of the first film stack.

In some embodiments, $M_1$ is at least a product of $M_3$ and $M_4$.

In some embodiments, the lower staircase structure further includes $M_5$ number of steps in a first direction, and each step of the lower staircase structure in the first direction includes $M_6$ number of steps in a second direction. $M_5$ and $M_6$ are whole numbers, and the first and second directions are perpendicular to each other and are in a plane parallel to a top surface of the first film stack.

In some embodiments, each step of the lower staircase structure in the second direction includes one layer of the second film stack, and each step of the lower staircase structure in the first direction includes $M_6+1$ number of layers of the second film stack.

In some embodiments, $M_2$ is at least a product of $M_5$ and $M_6$.

In some embodiments, each layer of the first and second film stacks includes a first dielectric layer and a second dielectric layer, and the first and second dielectric layers are arranged alternatingly on the substrate.

In some embodiments, each layer of the first and second film stacks includes a dielectric layer and a conductive layer, and the dielectric and conductive layers are arranged alternatingly on the substrate.

In some embodiments, the offset between the upper and lower staircase structures is at least one layer of the first or second film stack in a vertical direction, perpendicular to the top surface of the first or second film stack.

In some embodiments, the offset between the upper and lower staircase structures is between zero to 1 µm in a lateral direction, parallel to the top surface of the first or second film stack.

Another aspect of the present disclosure provides a method for forming a three-dimensional (3D) memory device. In some embodiments, a method for forming a three-dimensional memory structure includes forming a film stack with a plurality of layers on a substrate. The method also includes forming an upper staircase structure with $L_1$ number of steps in a first direction, wherein each step of the upper staircase structure in the first direction corresponds to $L_2$ number of steps in a second direction. $L_1$ and $L_2$ are whole numbers, and the first and second directions are perpendicular to each other and are on a plane parallel to a top surface of the substrate. The method further includes forming a lower staircase structure with $L_3$ number of steps in the first direction, wherein each step of the lower staircase structure in the first direction corresponds to $L_4$ number of steps in the second direction. $L_3$ and $L_4$ are whole numbers, and the lower staircase structure is located next to the upper staircase structure with an offset.

In some embodiments, the forming of the upper staircase structure includes disposing a first mask stack with a first division block on the film stack, and forming a first staircase structure on each side of the first division block. The forming of the upper staircase structure also includes disposing a second mask stack covering at least a portion of the first division block, and forming the upper staircase structure using the second mask stack.

In some embodiments, the forming of the first staircase structure on each side of the first division block includes etching one layer of the film stack, and trimming the first mask stack in the second direction. The forming of the first staircase structure also includes repeating the etching and trimming for $L_2$ times to form $L_2$ number of steps in the second direction.

In some embodiments, the forming of the upper staircase structure using the second mask stack includes etching $L_2+1$ number of layers of the film stack, and trimming the second mask stack in the first direction. The forming of the upper staircase structure also includes repeating the etching and trimming for $L_1$ times to form $L_1$ number of steps in the first direction.

In some embodiments, the forming of the lower staircase structure includes disposing a third mask stack with a second division block, wherein the third mask stack covers the upper staircase structure. The forming of the lower staircase structure also includes forming a third staircase structure on each side of the second division block, disposing a fourth mask stack covering the upper staircase structure and at least a portion of the second division block, and forming the lower staircase structure using the fourth mask stack.

In some embodiments, the forming of the third staircase structure on each side of the second division block includes etching one layer of the film stack, trimming the third mask stack in the second direction, and repeating the etching and trimming for $L_4$ times to form $L_4$ number of steps in the second direction.

In some embodiments, the forming of the lower staircase structure using the fourth mask stack includes etching $L_4+1$ number of layers of the film stack, trimming the fourth mask stack in the first direction, and repeating the etching and trimming for $L_3$ times to form $L_3$ number of steps in the first direction.

In some embodiments, each layer of the first or the second film stacks includes a first dielectric layer and a second dielectric layer, and the first and second dielectric layers are arranged alternatingly on the substrate.

In some embodiments, each layer of the first or the second film stacks includes a dielectric layer and a conductive layer, and the dielectric and conductive layers are arranged alternatingly on the substrate.

In some embodiments, the first staircase structure includes a number of layers no less than a product of $L_1$ and $L_2$, and the second staircase structure includes a number of layers no less than a product of $L_3$ and $L_4$.

In some embodiments, the offset between the first and second staircase structures is between zero to 1 μm in the first direction.

In some embodiments, the offset between the first and second staircase structures is at least one layer of the film stack in a vertical direction, perpendicular to the top surface of the substrate.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 12A and 12B illustrate a top-down and a 3D view of an exemplary 3D memory structure after forming fourth staircase structures, according to some embodiments of the present disclosure.

Figure 1:
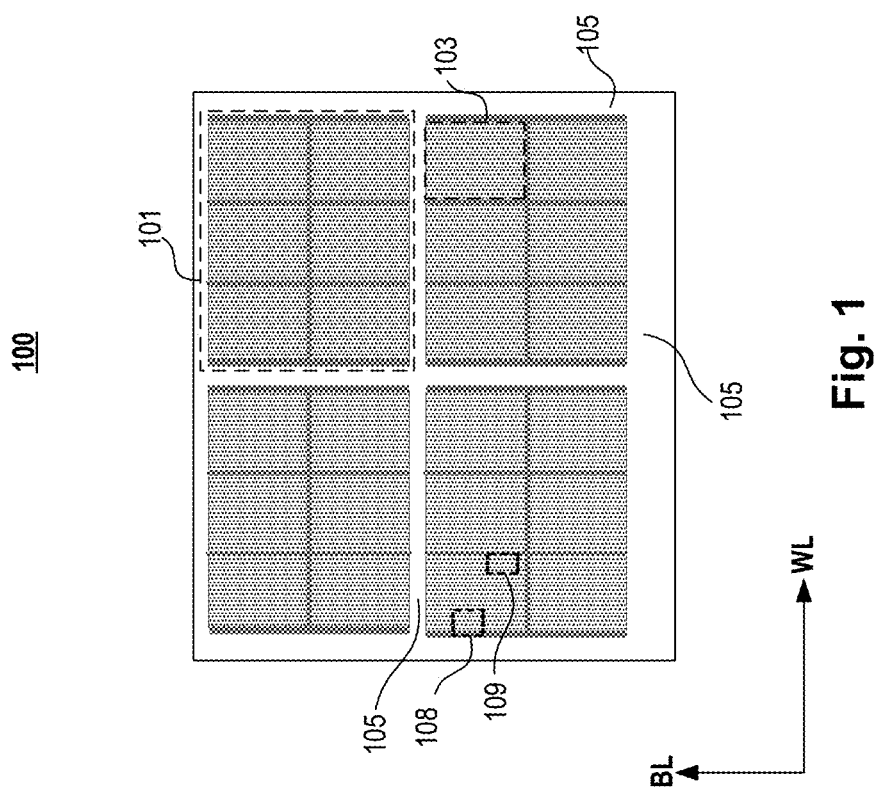
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more"

as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate. In the present disclosure, the term "each" may not only necessarily mean "each of all," but can also mean "each of a subset."

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

In some embodiments, a memory string of a 3D memory device includes a semiconductor pillar (e.g., silicon channel) that extends vertically through a plurality of conductive and dielectric layer pairs. The plurality of conductive and dielectric layer pairs are also referred to herein as an "alternating conductive and dielectric stack." An intersection of the conductive layer and the semiconductor pillar can form a memory cell. The conductive layer of the alternating conductive and dielectric stack can be connected to a word line at the back-end-of-line, wherein the word line can electrically connect to one or more control gates. For illustrative purposes, word lines and control gates are used interchangeably to describe the present disclosure. The top of the semiconductor pillar (e.g., transistor drain region) can be connected to a bit line (electrically connecting one or more semiconductor pillars). Word lines and bit lines are typically laid perpendicular to each other (e.g., in rows and columns, respectively), forming an "array" of the memory, also called a memory "block" or an "array block".

A memory "die" may have one or more memory "planes", and each memory plane may have a plurality of memory blocks. An array block can also be divided into a plurality of memory "pages", wherein each memory page may have a plurality of memory strings. In a flash NAND memory device, erase operation can be performed for every memory block and read/write operation can be performed for every memory page. The array blocks are the core area in a memory device, performing storage functions. To achieve higher storage density, the number of vertical 3D memory stacks is increased greatly, adding complexity and cost in manufacturing.

A memory die has another region, called the periphery, which provides supporting functions to the core. The periphery region includes many digital, analog, and/or mixed-signal circuits, for example, row and column decoders, drivers, page buffers, sense amplifiers, timing and controls, and the like circuitry. Peripheral circuits use active and/or passive semiconductor devices, such as transistors, diodes, capacitors, resistors, etc., as would be apparent to a person of ordinary skill in the art.

Other parts of the memory devices are not discussed for ease of description. In the present disclosure, a "memory device" is a general term and can be a memory chip (package), a memory die or any portion of a memory die.

Although using three-dimensional NAND devices as examples, in various applications and designs, the disclosed structures can also be applied in similar or different semiconductor devices to, e.g., to improve metal connections or wiring. The specific application of the disclosed structures should not be limited by the embodiments of the present disclosure.

FIG. 1 illustrates a top-down view of an exemplary three-dimensional (3D) memory device 100, according to some embodiments of the present disclosure. The 3D memory device 100 can be a memory die and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly, forming an array of metal lines. The direction of bit lines and word lines are labeled as "BL" and "WL" in FIG. 1. In this disclosure, memory blocks 103 are also referred to as "memory arrays."

The 3D memory device 100 also includes a periphery region 105, an area surrounding memory planes 101. The periphery region 105 contains peripheral circuits to support functions of the memory array, for example, page buffers, row and column decoders and sense amplifiers.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

In some embodiments, the memory arrays and the peripheral circuits of the 3D memory device 100 can be formed on different substrates and can be joined together to form the 3D memory device 100 through wafer bonding. In this example, through array contact structures can provide vertical interconnects between the memory arrays and peripheral circuits, thereby reducing metal levels and shrinking die size. Detailed structure and method of 3D memory with hybrid bonding is described in co-pending U.S. patent application, titled "Hybrid Bonding Contact Structure of Three-Dimensional Memory Device," (application Ser. No. 16/046,852 and filed on Jul. 26, 2018), which is incorporated herein by reference in its entirety.

Figure 2:
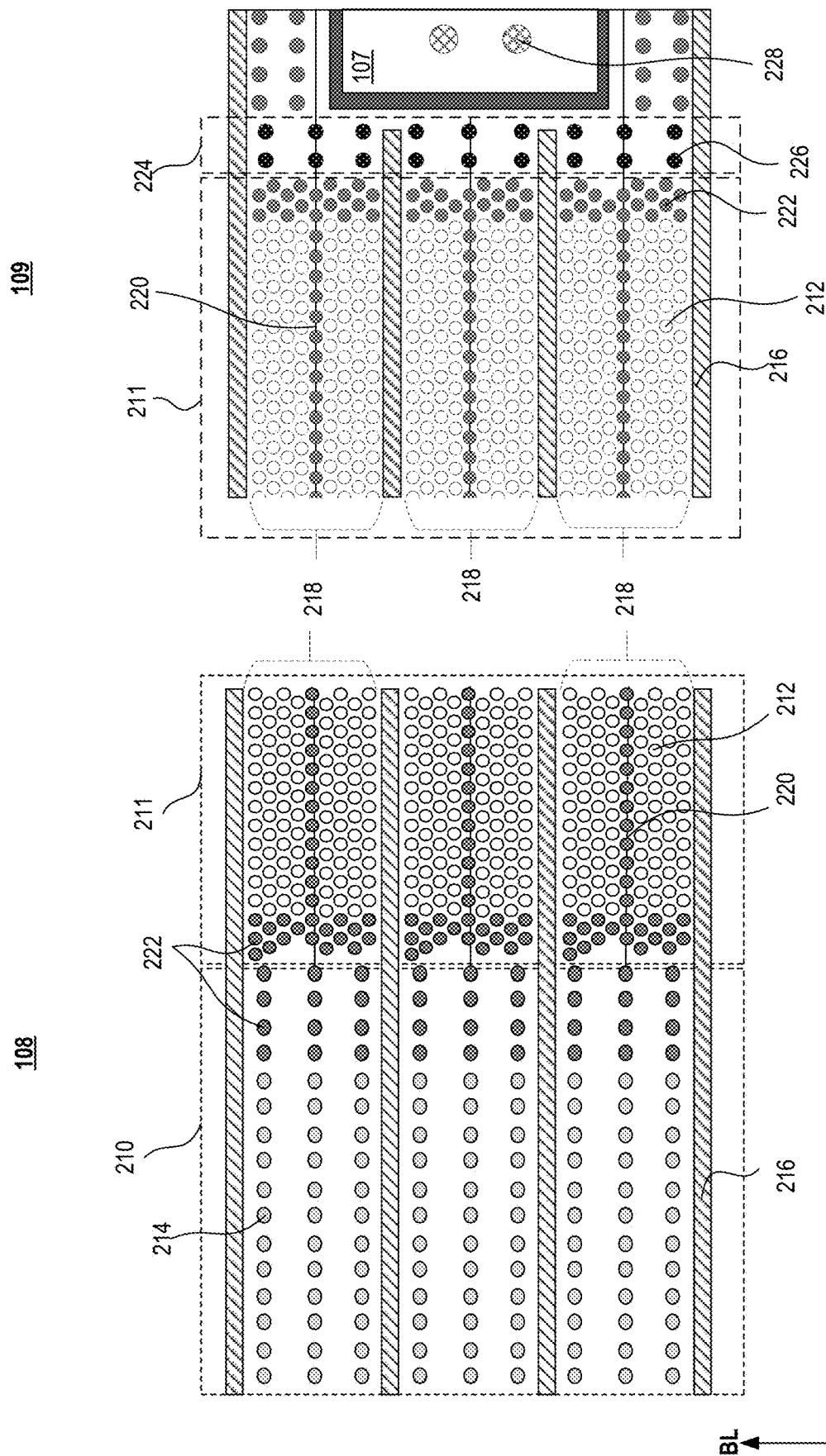
FIG. 2A-2B illustrate schematic top-down views of some regions of 3D memory die, according to some embodiments of the present disclosure.

Referring to FIG. 2A, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact for an array of memory strings 212 in channel structure regions 211. A top select gate cut 220 can be disposed in the middle of each memory finger 218 to divide a top select gate (TSG) of the memory finger 218 into two portions, and thereby can divide a memory finger into two programmable (read/write) pages. While erase operation of a 3D NAND memory can be carried out at memory block level, read and write operations can be carried out at memory page level. A page can be kilobytes (KB) in size. In some embodiments, region 108 also includes dummy memory strings 222 for process variation control during fabrication and/or for additional mechanical support.

Referring to FIG. 2B, an enlarged top-down view of a region 109 in FIG. 1 is illustrated, according to some embodiments of the present disclosure. The region 109 of the 3D memory device 100 can include the channel structure region 211, a through array contact region 107, and a top select gate (TSG) staircase region 224.

The channel structure region 211 in the region 109 can be similar to the channel structure region 211 in region 108. The TSG staircase region 224 can include an array of TSG contacts 226 formed on the staircase structure. The TSG staircase region 224 can be disposed on the sides of the channel structure region 211 and adjacent to through array contact region 107 in the top-down view. Multiple through array contacts 228 can be formed in the through array contact region 107.

Figure 3:
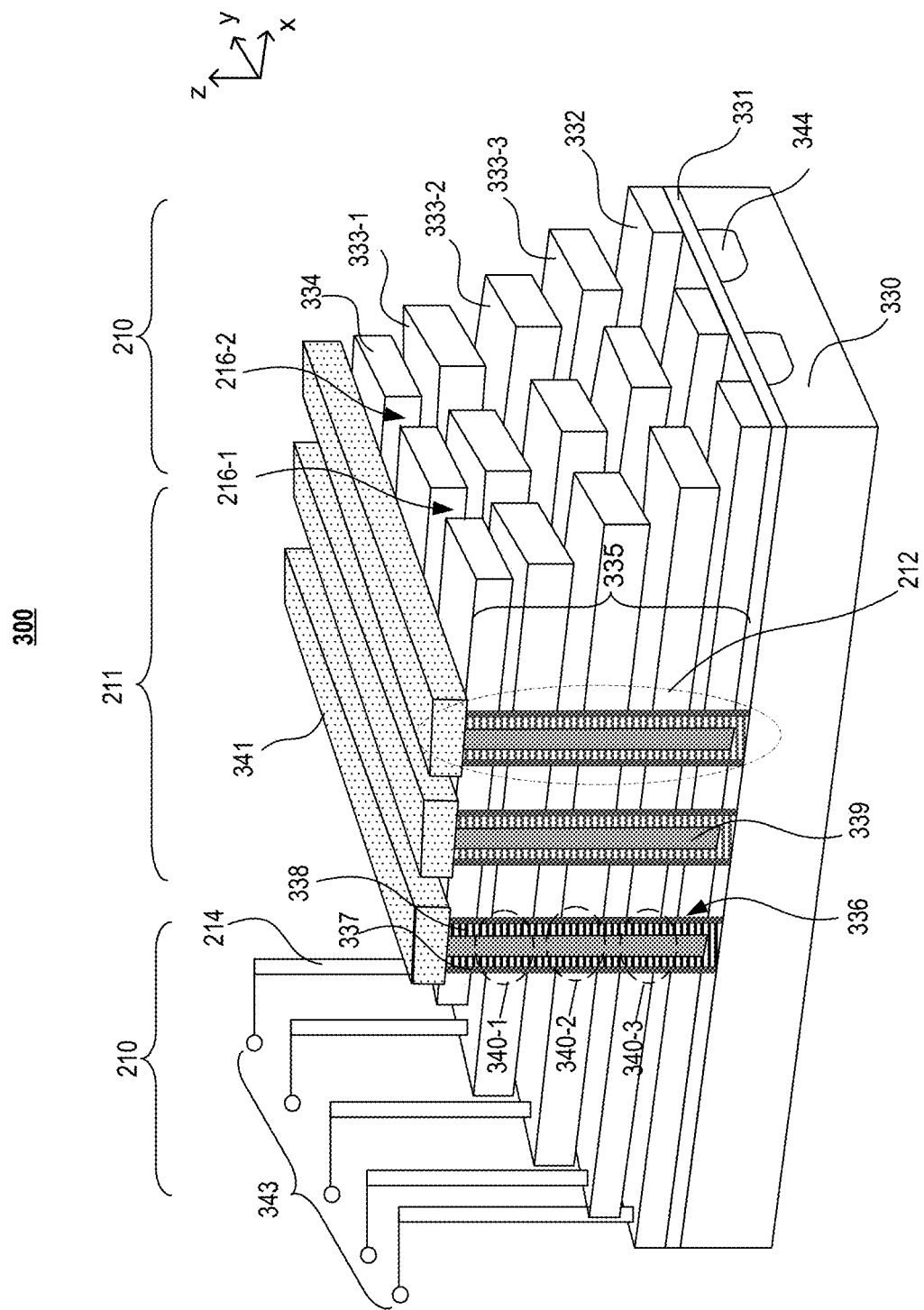
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected to the memory strings 212 over the TSGs 334. The memory array structure 300 also includes a plurality of metal interconnect lines 343 connected to the gate electrodes through a plurality of contact structures 214. The edge of the film stack 335 is configured in a shape of staircase to allow an electrical connection to each tier of the gate electrodes. The channel structure region 211 and the staircase region 210 correspond to the channel structure region 211 and the staircase region 210 in the top-down view of FIG. 2A, where one of the staircase regions 210 in FIG. 3 can be used as TSG staircase region 230 for TSG connection.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, through array contact, TSG cut, common source contact and dummy channel structure. These structures are not shown in FIG. 3 for simplicity.

With the demand for higher storage capacity in a NAND flash memory, the number of vertical tiers of 3D memory cells 340 or word lines 333 increases accordingly, leading to more process complexity and higher manufacturing cost. When increasing the tiers of memory cells 340 or word lines 333 of the memory array structure 300, it becomes more challenging to etch deeper channel holes 336 for the memory strings 212 and also more challenging to form contact structures 214 on the staircase structures. For example, to form the contact structures 214 on a large number of vertically stacked word lines (gate electrodes), a high aspect ratio etching is needed to form contact holes. During prolonged high aspect ratio etching, the critical dimension (CD) of the contact holes on the lower level of the staircase structure can be much larger than the CD of contact holes on the top level of the staircase structure. In addition, profile of contact holes on the lower level of the staircase structure can have large bowing. Large CD bias and bowing profile among contact structures not only creates memory performance variation due to metal loading difference, but may also cause yield loss due to electrical shorts between neighboring contact structures.

To alleviate etching and deposition difficulties with more and more vertically stacked word lines, portions of a 3D memory device can be formed on two or more wafers and then joined together through wafer bonding or flip-chip bonding. Alternatively, a 3D memory device can be formed by sequentially stacking multi-sessions, wherein each session contains a stack of word lines with less number of tiers. However forming a high stacked staircase structure and forming corresponding contact structures remain as challenging issues.

In the present disclosure, staircase structure with multiple divisions and fabrication methods thereof are disclosed for a 3D memory device.

In the present disclosure, a staircase structure refers to a set of surfaces that include at least two horizontal surfaces (e.g., along x-y plane) and at least two (e.g., first and second) vertical surfaces (e.g., along z-axis, or z-direction) such that each horizontal surface is adjoined to a first vertical surface that extends upward from a first edge of the horizontal surface, and is adjoined to a second vertical surface that extends downward from a second edge of the horizontal surface. Each of the horizontal surfaces is referred as a "step" or "stair" of the staircase structure. In the present disclosure, a horizontal direction can refer to a direction (e.g., the x-axis/x-direction or the y-axis/y-direction) parallel with a top surface of the substrate (e.g., the substrate that provides the fabrication platform for formation of structures over it), and a vertical direction can refer to a direction (e.g., the z-axis) perpendicular to the top surface of the structure.

A staircase structure can be formed from a plurality of layer stacks by repetitively etching each layer stack using a mask layer formed over the dielectric stack layer, where each layer stack is also referred to as a "staircase layer" (or "SC layer") of the staircase structure in the present disclosure. A step of the staircase structure exposes a portion of a top surface of a layer stack (e.g., a SC layer) of the plurality of layer stacks. In the present disclosure, a layer stack (e.g., a SC layer) of the plurality of layer stacks is one level. In other words, each layer stack is one level high vertically.

In a staircase structure, each staircase step terminates at a shorter length than the staircase step underneath, where each staircase step can have the same or different width than the staircase step underneath or above. In this disclosure for illustration purpose, each staircase step can have the same dimension as the staircase step underneath and above.

Figure 4:
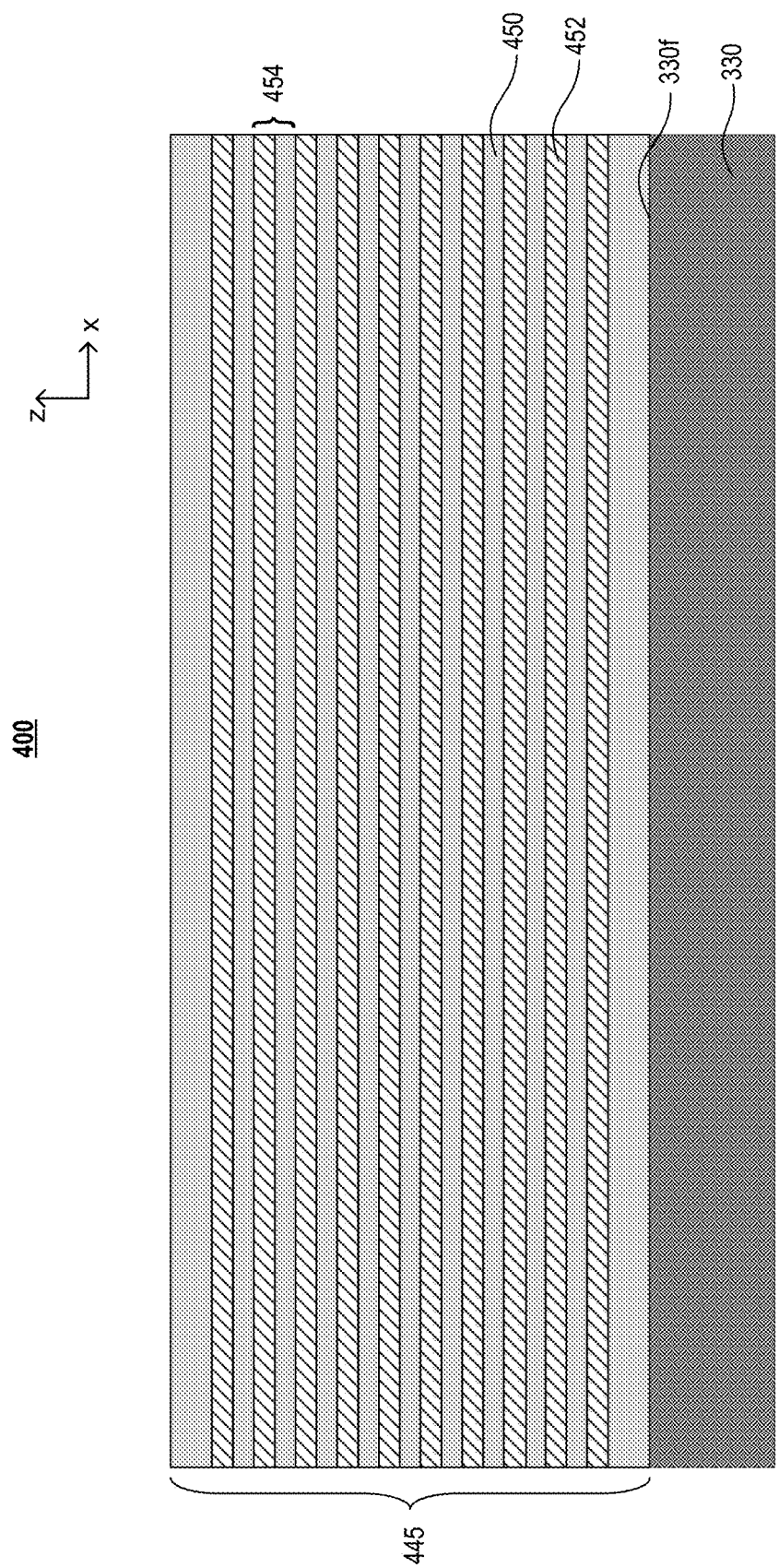
FIG. 4 illustrates a schematic cross-sectional view of an exemplary 3D memory structure at certain fabricating stages, according to some embodiments of the present disclosure.

FIG. 4 illustrates a cross-sectional view of an exemplary structure 400 of a three-dimensional memory device, according to some embodiments, where the structure 400 includes a substrate 330 and a film stack 445. The cross-sectional view of FIG. 4 is along WL direction in FIG. 2A, i.e., along x-direction in FIG. 3.

The substrate 330 can provide a platform for forming subsequent structures. In some embodiments, the substrate 330 includes any suitable material for forming the three-dimensional memory device. The substrate 330 can include any other suitable material, for example, silicon, silicon germanium, silicon carbide, silicon on insulator (SOI), germanium on insulator (GOI), glass, gallium nitride, gallium arsenide, III-V compound, and/or any combinations thereof.

A front surface 330f of the substrate 330 is also referred to as a "main surface" or a "top surface" of the substrate herein. Layers of materials can be disposed on the front surface 330f of the substrate. A "topmost" or "upper" layer is a layer farthest or farther away from the front surface 330f of the substrate. A "bottommost" or "lower" layer is a layer closest or closer to the front surface 330f of the substrate.

Referring to FIG. 1 and FIG. 3, in some embodiments, peripheral devices can be formed in the periphery region 105 on the front surface 330f of the substrate 330. In some embodiments, active device areas can be formed in the memory blocks 103 on the front surface 330f of the substrate 330. In some embodiments, the substrate 330 can further include an insulating film 331 on the front surface 330f. The insulating film 331 can be made of the same or different material from the dielectric film stack.

The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls.

The active device areas in the memory blocks are surrounded by isolation structures, such as shallow trench isolation. Doped regions, such as p-type doped and/or n-type doped wells, can be formed in the active device area according to the functionality of the array devices in the memory blocks.

The film stack 445 extends in a lateral direction that is parallel to the front surface 330f of the substrate 330. The film stack 445 includes a dielectric layer 450 (also referred to as "first dielectric layer") and a sacrificial layer 452 (also referred to as "second dielectric layer") alternatingly stacked on each other, where the dielectric layer 450 can be configured to be the bottommost and the topmost layers of the film stack 445. In this configuration, each sacrificial layer 452 can be sandwiched between two dielectric layers 450, and each dielectric layer 450 can be sandwiched between two sacrificial layers 452 (except the bottommost and the topmost layer).

The dielectric layer 450 and the underlying sacrificial layer 452 are also referred to as an alternating dielectric layer pair 454. The formation of the film stack 445 can include disposing the dielectric layers 450 to each have the same thickness or to have different thicknesses. Example thicknesses of the dielectric layers 450 can range from 10 nm to 500 nm. Similarly, the sacrificial layer 452 can each have the same thickness or have different thicknesses. Example thicknesses of the sacrificial layer 452 can range from 10 nm to 500 nm.

Although only 21 total layers are illustrated in the film stack 445 in FIG. 4, it should be understood that this is for illustrative purposes only and that any number of layers may be included in the film stack 445.

In some embodiments, the film stack 445 can include layers in addition to the dielectric layer 450 and the sacrificial layer 452, and can be made of different materials and with different thicknesses.

In some embodiments, the dielectric layer 450 includes any suitable insulating materials, for example, silicon oxide, silicon oxynitride, silicon nitride, TEOS or silicon oxide with F-, C-, N-, and/or H-incorporation. The dielectric layer 450 can also include high-k dielectric materials, for example, hafnium oxide, zirconium oxide, aluminum oxide, tantalum oxide, or lanthanum oxide films.

The formation of the dielectric layer 450 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the sacrificial layer 452 includes any suitable material that is different from the dielectric layer 450 and can be removed selectively. For example, the sacrificial layer 452 can include silicon oxide, silicon oxynitride, silicon nitride, TEOS, poly-crystalline silicon, poly-crystalline germanium, poly-crystalline germanium-silicon, and any combinations thereof. In some embodiments, the sacrificial layer 452 also includes amorphous semiconductor materials, such as amorphous silicon or amorphous germanium. The sacrificial layer 452 can be disposed using a similar technique as the dielectric layer 450, such as CVD, PVD, ALD, thermal oxidation or nitridation, or any combination thereof.

In some embodiments, the dielectric layer 450 can be silicon oxide and the sacrificial layer 452 can be silicon nitride.

In some embodiments, the sacrificial layer 452 can be replaced by a conductive layer, where the conductive layer can include any suitable conductive material, for example, poly-crystalline silicon, poly-crystalline germanium, poly-crystalline germanium-silicon, or any combination thereof. In some embodiments, the conductive layer can also include amorphous semiconductor materials, such as amorphous silicon, amorphous germanium or any combination thereof. In some embodiments, the poly-crystalline or amorphous material of the conductive layer can be incorporated with any suitable type of dopant, such as boron, phosphorous, or arsenic, to increase the conductivity of the material. The formation of the conductive layer can include any suitable deposition methods such as, CVD, RTCVD, PECVD, LPCVD, MOCVD, HDP-CVD, PVD, ALD or any combination thereof. In some embodiments, poly-crystalline semiconductor material can be deposited in an amorphous state and converted to poly-crystalline through subsequent thermal treatments. In some embodiments, the dopants in the conductive layer can be incorporated through in-situ doping as the poly-crystalline or amorphous semiconductor material being deposited, by simultaneously flowing chemical gas, for example, diborane ($B_2H_6$) or phosphine ($PH_3$). Other doping techniques for 3D structure, such as plasma doping, can also be used to increase conductivity of the conductive layer. In some embodiments, after dopant incorporation, a high temperature annealing process can be performed to active the dopants in the conductive layer. In some embodiments, the dielectric layer 450 can be silicon oxide and the conductive layer can be poly-crystalline silicon. In the present disclosure, the sacrificial layer 452 is illustrated as an example. However a person skilled in the art can replace the sacrificial layer 452 with the conductive layer for the structures and methods described below.

Figure 5:
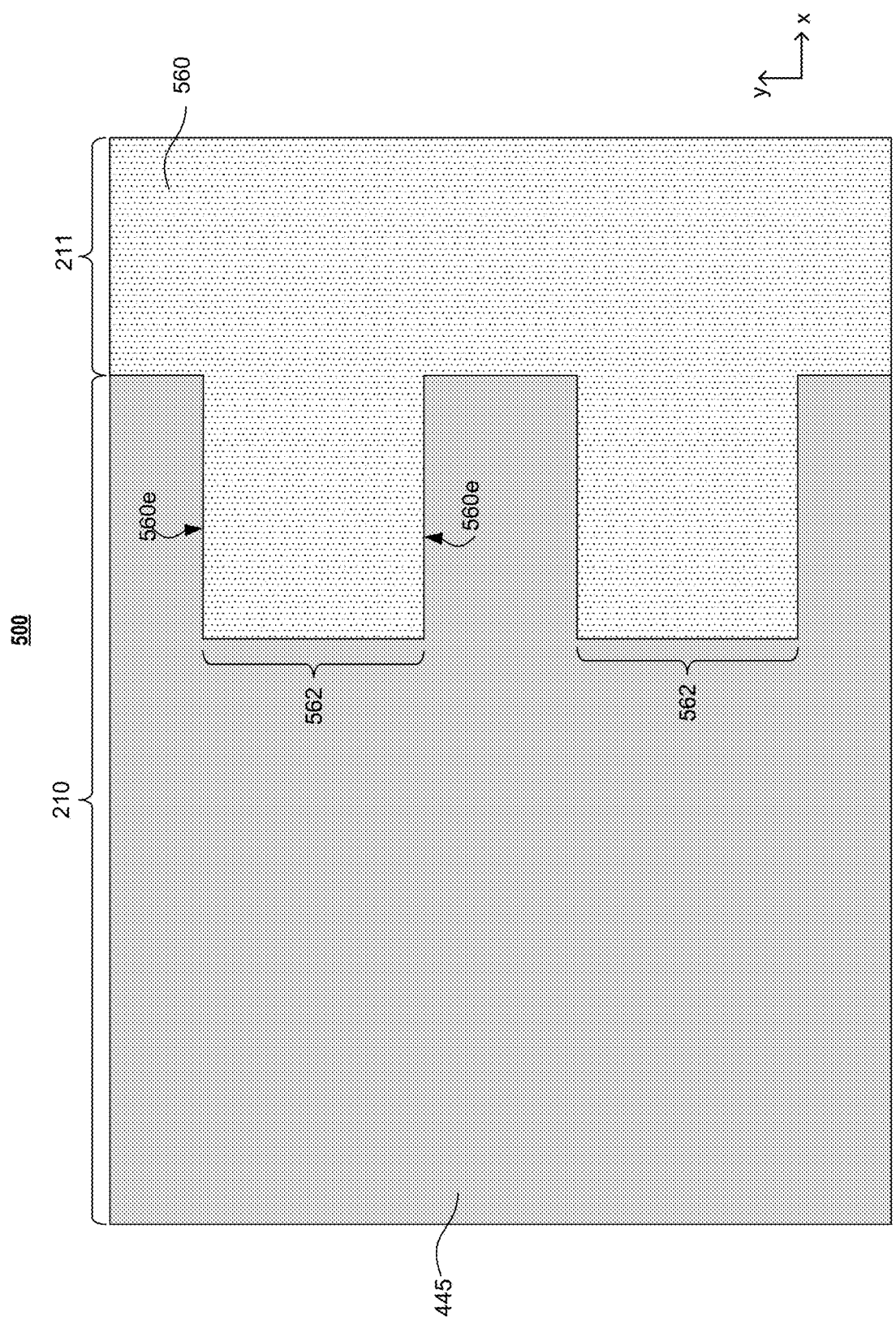
FIG. 5 illustrates a top-down view of an exemplary 3D memory structure with a first mask stack, according to some embodiments of the present disclosure.

FIG. 5 illustrates a top-down view of a 3D memory device 500, according to some embodiments. The 3D memory device 500 includes a first mask stack 560 disposed on the structure 400, where the first mask stack 560 covers the channel structure region 211 and a portion of the staircase region 210 adjacent to the channel structure region 211. The first mask stack 560 includes a plurality of first division blocks 562 extended in x-direction into staircase region 210 and arranged along y-direction, where y-direction is perpendicular to x-direction on a plane parallel to substrate surface 330f. The two sides of each first division blocks 562 in y-direction can be bounded by the two edges 560e of the first mask stack 560. In FIG. 5, two first division blocks 562 are shown as an example. In some embodiments, 3D memory device 500 can include more than two first division blocks 562. In some embodiments, more than one staircase regions 210 can be formed adjacent to channel structure region 211.

In some embodiments, the first mask stack 560 can include a photoresist or carbon-based polymer material, and can be formed using a patterning process such as lithography. In some embodiments, the first mask stack 560 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using $O_2$ or $CF_4$ chemistry. Furthermore, the first mask stack 560 can include any combination of photoresist and hard mask.

Figure 6A:
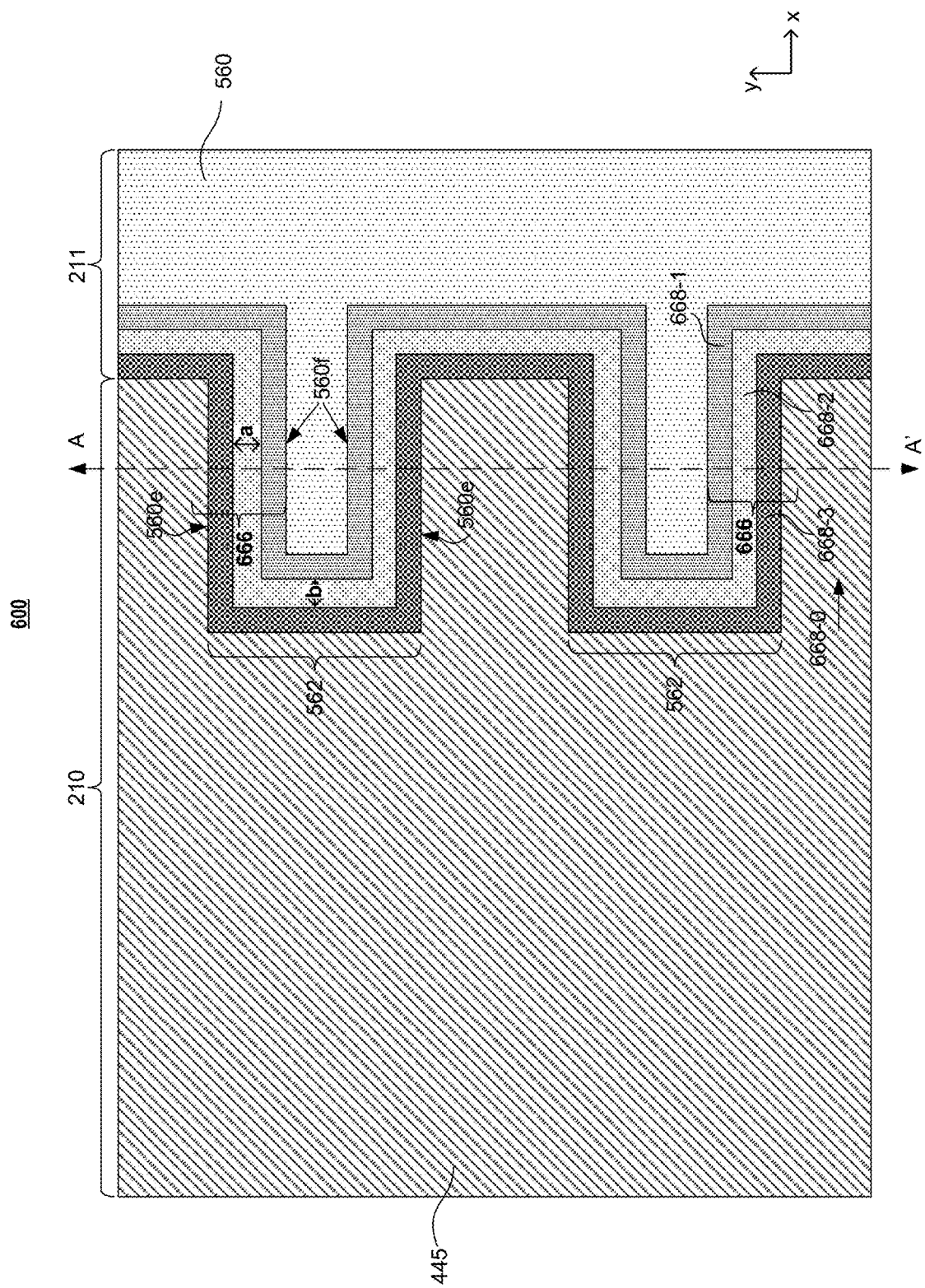
FIGS. 6A and 6B illustrate a top-down and a schematic cross-sectional views of an exemplary 3D memory structure after forming first staircase structures, according to some embodiments of the present disclosure.
Figure 6B:
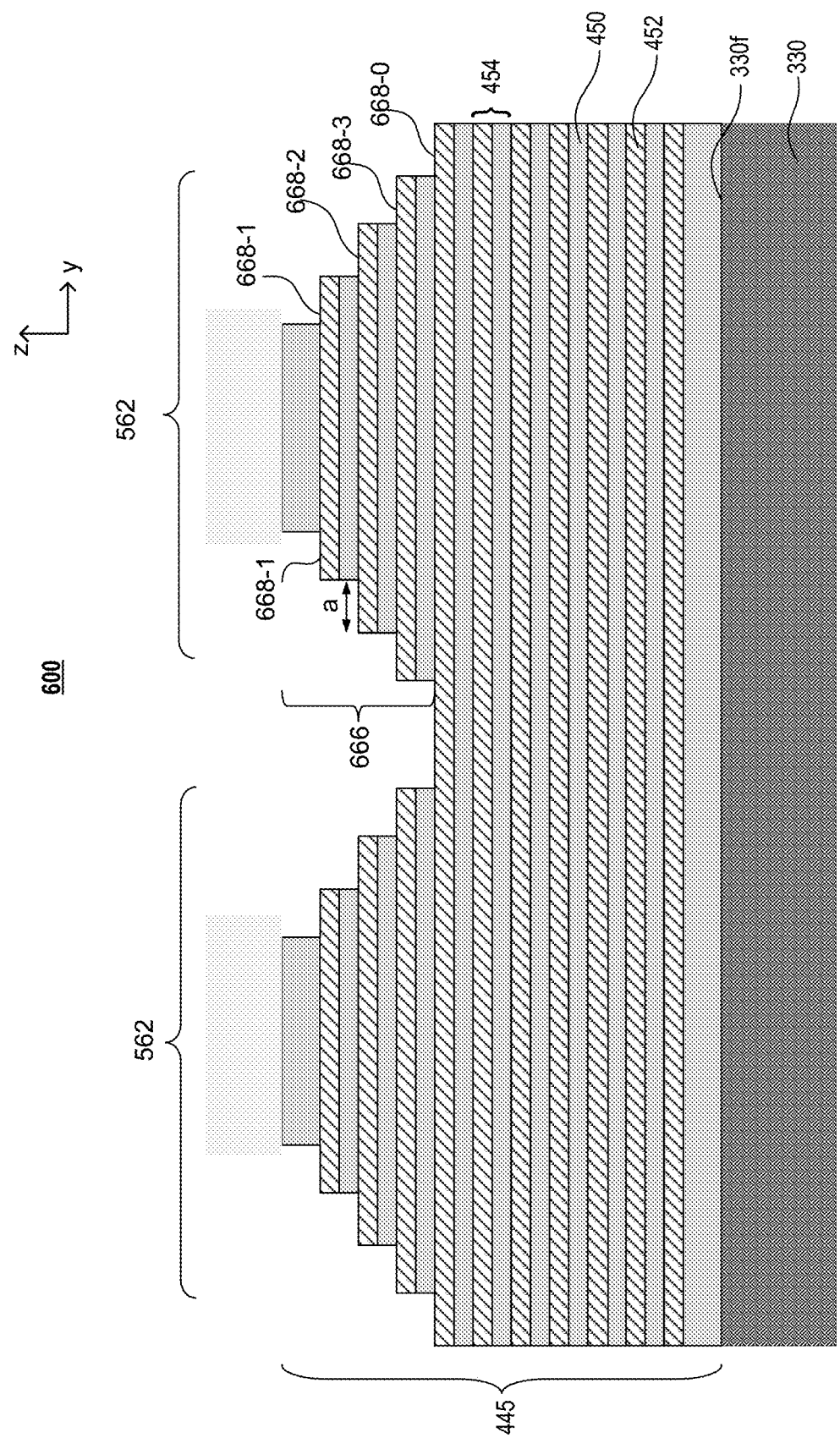

FIG. 6A illustrates a top-down view of an exemplary structure 600 of a three dimensional memory device according to some embodiments. FIG. 6B illustrates an exemplary cross-sectional view of the structure 600 along line AA', a direction parallel to y-direction, according to some embodiments. The structure 600 includes a first staircase structure 666 formed in the film stack 445 at each side of each first division block 562. The first staircase structure 666 includes a plurality of first staircase steps or staircase layers 668 (e.g., 668-0, 668-1, 668-2, 668-3) with a width of "a" in y-direction and a width "b" in x-direction. In some embodiments, width "a" can be the same dimension as width "b". In some embodiments, width "a" can be a different dimension from width "b". In FIGS. 6A and 6B, each first staircase structure 666 includes four first staircase steps 668-0, 668-1, 668-2 and 668-3 as illustration. However, the number of the first staircase steps is not limited, and can be any whole number $N_1$.

The first staircase structure 666 can be formed by applying a repetitive etch-trim process on the film stack 445 using the first mask stack 560. The etch-trim process includes an etching process and a trimming process. During the etching process, a portion of each first staircase step 668 with exposed surface can be removed. The etch depth is determined by a thickness of the first staircase step 668. In some embodiments, the thickness of the first staircase step 668 can be a thickness of one alternating dielectric layer pair 454. In this example, the etching process for the dielectric layer 450 can have a high selectivity over the sacrificial layer 452, and/or vice versa. Accordingly, an underlying alternating dielectric layer pair 454 can function as an etch-stop layer. And as a result, one staircase step can be formed during each etch-trim cycle.

In some embodiments, the first staircase steps 668 can be etched using an anisotropic etching such as a reactive ion etch (RIE) or other dry etch processes. In some embodiments, the dielectric layer 450 is silicon oxide. In this example, the etching of silicon oxide can include RIE using fluorine based gases such as carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the sacrificial layer 452 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer stack should not be limited by the embodiments of the present disclosure.

The trimming process includes applying a suitable etching process (e.g., an isotropic dry etch or a wet etch) on the first mask stack 560 such that the first mask stack 560 can be pulled back laterally in the x-y plane, parallel to the front surface 330f of the substrate 330. From top-down view in FIG. 6A, the first mask stack 560 can be etched incrementally and inwardly from initial pattern defined by, for example, photoresist from lithography. In this example, the edge 560e of the initial pattern can be trimmed incrementally towards a final edge 560f. The lateral pull-back dimension at etch trimming process determines the lateral dimension "a" of each step of the first staircase structure 666 in the y-direction and the lateral dimension "b" of each step of the first staircase structure 666 in x-direction. In some embodiments, each of the first staircase steps 668 can have a different or same lateral dimension in y-direction. In some embodiments, each of the first staircase steps 668 can have a different or same lateral dimension in x-direction. In some embodiments, trimming of the first mask stack 560 can be isotropic in all directions in the x-y plane such that the width "a" in y-direction can be the same as the width "b" in x-direction. In some embodiments, the width "a" and "b" can be between 10 nm and 100 nm. After trimming the first mask stack 560, one portion of the topmost level of the first staircase structure 666 is exposed and the other portion of the topmost level of the first staircase structure 666 remains covered by the first mask stack 560. The next cycle of etch-trim process resumes with the etching process.

In some embodiments, the trimming process can include dry etching, such as RIE using $O_2$, Ar, $N_2$, etc.

In some embodiments, the topmost level of the first staircase structure 666 can be covered by the dielectric layer 450. In some embodiments, the topmost level of the first staircase structure 666 can further be covered by other dielectric materials. A process step of removing the dielectric layer 450 and/or the other dielectric materials can be added to the etching process of each etch-trim cycle to form the first staircase structure 666.

By repeating etch-trim process, the first staircase steps 668-1, 668-2 and 668-3 can be formed from top to bottom and from outer (e.g., the edge 560e) to inner (e.g., the edge 560f) for each first staircase structure 666 at each side of each first division block 562. During etch-trim process, some of the first mask stack 560 may be consumed, and the thickness of the first mask stack 560 may be reduced. In some embodiments, two or more first mask stacks 560 can be used to form the first staircase structure 666.

In some embodiments, a portion of the sacrificial layer 452 of each first staircase step 668 can be exposed, as shown in FIGS. 6A and 6B. In this example, the sacrificial layer 452 can also be exposed in an area 668-0 of the staircase region 210 outside the first division blocks 562, where the area 668-0 can be an etching stop for the first staircase structure 666.

After forming the structure 600, the first mask stack 560 can be removed (shown in FIG. 6B). The first mask stack 560 can be removed by using techniques such as dry etching with $O_2$ or $CF_4$ plasma, or wet etching with resist/polymer stripper, for example solvent based chemicals.

Figure 7:
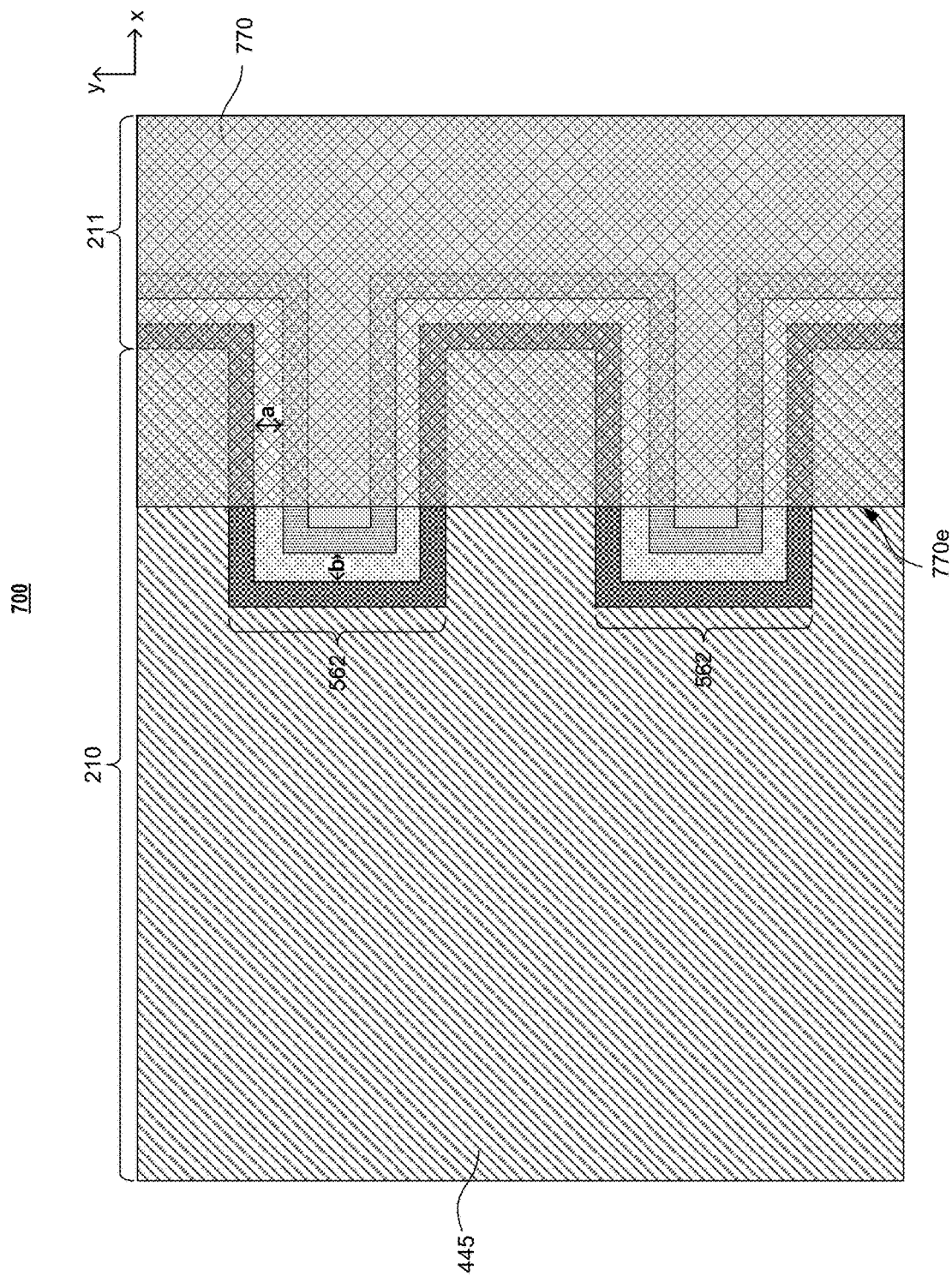
FIG. 7 illustrates a top-down view of an exemplary 3D memory structure with a second mask stack, according to some embodiments of the present disclosure.

FIG. 7 illustrates a top-down view of an exemplary structure 700 of a 3D memory device, according to some embodiments. The exemplary structure 700 includes a second mask stack 770 disposed over the channel structure region 211 and a portion of the staircase region 210. The second mask stack 770, having an edge 770e, covers a portion of the first division blocks 562 in the x-direction, and extends along y-direction. The second mask stack 770 can be made of a similar material as the first mask stack 560 and can be formed using a similar technique.

Figure 8A:
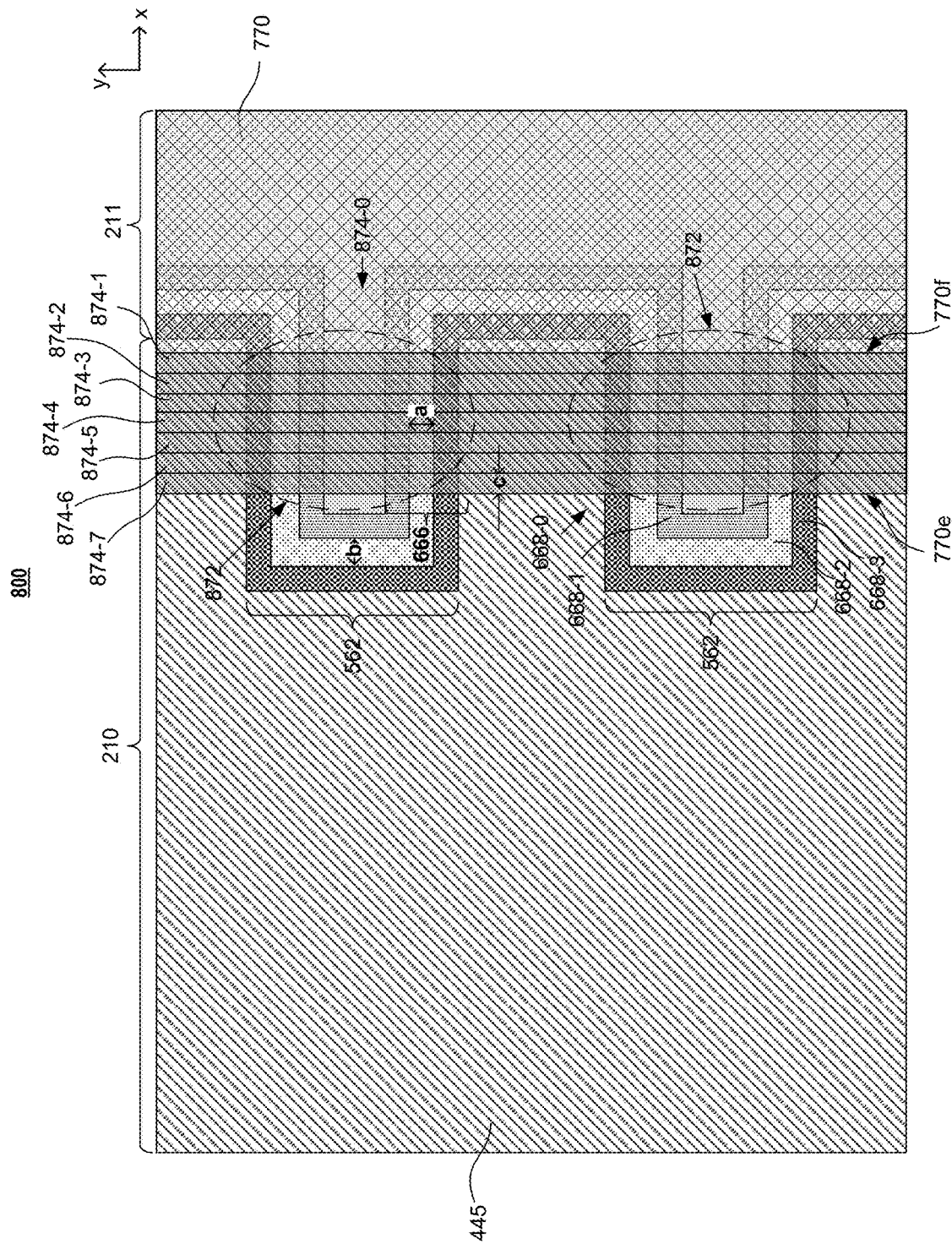
FIGS. 8A and 8B illustrate a top-down and a 3D view of an exemplary 3D memory structure after forming second staircase structures, according to some embodiments of the present disclosure.
Figure 8B:
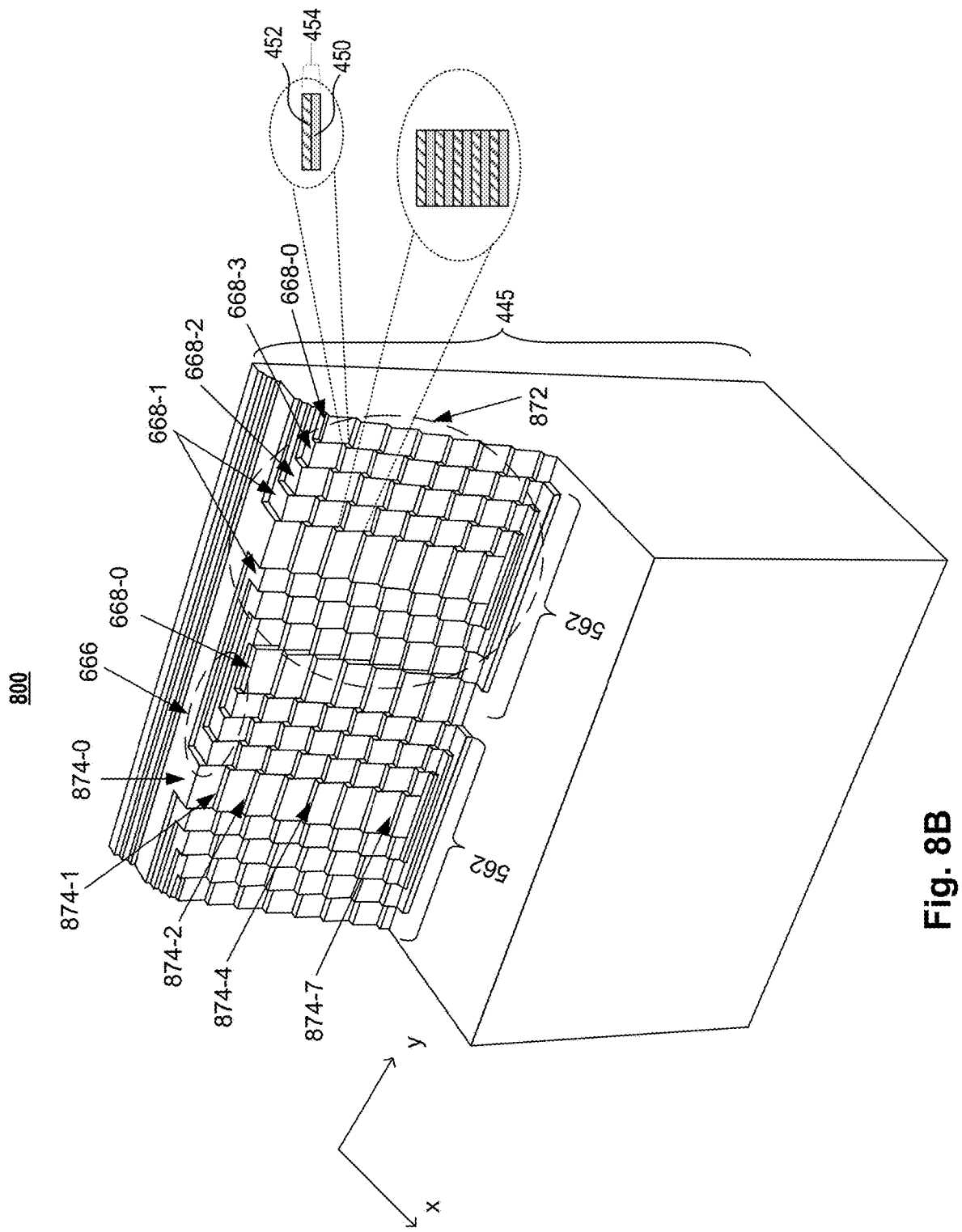

FIG. 8A illustrates a top-down view of an exemplary structure 800 of a 3D memory device, according to some embodiments. FIG. 8B illustrates a three-dimensional view of the structure 800. The structure 800 includes a second staircase structure 872 formed on each of the first division blocks 562. The second staircase structure 872 includes a plurality of second staircase steps 874 oriented in x-direction (for example, 874-0, 874-1, 874-2, . . . , and 874-7), where each second staircase step 874 corresponds to two symmetrically distributed first staircase structures 666. The first staircase structure 666 includes a plurality of first staircase steps 668, oriented in y-direction on both sides of the first division blocks 562, for example, 668-0, 668-1, 668-2 and 668-3. FIGS. 8A and 8B illustrate eight of the second staircase steps 874 oriented in x-direction. However, the number of the second staircase steps is not limited, and can be any whole number $N_2$. In some embodiments, the second staircase structure 872 can be disposed on each of the first division blocks 562, and can be repeated in y-direction.

In some embodiments, the second staircase steps 874 can be formed by applying repetitive etch-trim process on the structure 700 (in FIG. 7) using the second mask stack 770, similar to the repetitive etch-trim process to form the first staircase steps 668. In this example, the second staircase steps 874 can be formed by trimming the second mask stack 770 in x-direction, from the edge 770e of initial pattern defined by, e.g., lithography to a final edge 770f.

During etch-trim process, some of the second mask stack 770 may be consumed, and the thickness of the second mask stack 770 may be reduced. To achieve high vertical stack of the second staircase structure 872, two or more second mask stacks 770 can be used, according to some embodiments. In this example, more numbers of the second staircase steps $N_2$ can be formed by etch-trim process using multiple masks.

In some embodiments, the trimming process, included in the etch-trim process, determines a width "c" of the second staircase step 874. The dimension of the first staircase steps 668 in the x-y plane can therefore have "c" in x-direction and "a" in y-direction. In some embodiments, each of the second staircase steps 874 can have the same width "c". In some embodiments, each of the second staircase steps can have a different width. In some embodiments, width "c" of the second staircase step 874 in the second staircase structure 872 can be between 10 nm and 100 nm in x-direction. The second mask stack 770 can be removed after forming the second staircase structure 872, exposing the film stack 445 from the top (shown in FIG. 8B).

In some embodiments, in the structure 800, each of the second staircase steps 874 can correspond to two symmetrically distributed first staircase structures 666 along y-direction. Each pair of the two symmetrically distributed first staircase steps (e.g., 668-1 in FIG. 8B) corresponds to the same alternating dielectric layer pair 454 of the film stack 445 (e.g., 668-1 in FIG. 6B), and therefore can be connected to the same control gate or word line 333 of the memory cell 340 (in FIG. 3). In some embodiments, each first staircase structure 666 includes four first staircase steps 668 (e.g., structure 800 in FIGS. 8A and 8B). In this example, each of the second staircase steps 874 corresponds to four first staircase steps 668 on each side. In some embodiments, each first staircase step 668 includes one alternating dielectric layer pair 454. In this example, each etching process used to form each first staircase step 668 includes etching one alternating dielectric layer pairs 454. Each etching process used to form each second staircase step 874, includes etching five alternating dielectric layer pairs 454. A thickness of the second staircase step 874 can be a total thickness of five alternating dielectric layer pairs 454, or a total thickness of five first staircase steps 668. As shown in FIGS. 8A and 8B, the second staircase steps 874 can be oriented in x-direction, while the first staircase steps 668 can be oriented in y-direction. In the second staircase structure 872, each second staircase step 874 in x-direction corresponds to four first staircase steps 668 on each side in y-direction.

In some embodiments, the first staircase structure 666 can include $N_1$ number of first staircase steps 668 in y-direction. Each of the second staircase steps 874 corresponds to two symmetrically distributed first staircase structures 666 on each side in y-direction. A pair of the symmetrically distributed first staircase steps 668 can correspond to the same alternating dielectric layer pair 454, and can be connected to the same control gate or word line 333 of the memory cell 340 in FIG. 3. In this example, each of the second staircase steps 874 can correspond to $N_1$ number of first staircase steps 668 in y-direction on each side. In some embodiments, each of the first staircase steps 668 includes one alternating dielectric layer pair 454. In this example, each etching process used to form each first staircase step 668, includes etching one alternating dielectric layer pairs 454.

In some embodiments, each etching process used to form the second staircase step 874, includes etching $N_1+1$ number of alternating dielectric layer pairs 454. The thickness of the second staircase step 874 can be a total thickness of $N_1+1$ number of alternating dielectric layer pairs 454, or a total thickness of $N_1+1$ number of first staircase steps 668. In the second staircase structure 872, the second staircase steps 874 can be oriented in x-direction, while the first staircase steps 668 on each side can be oriented in y-direction. In this example, each second staircase step 874 in x-direction corresponds to $N_1$ number of first staircase steps 668 in y-direction on each side. In some embodiments, the number of the second staircase steps 874 can be $N_2$. In this example, a total number of the first staircase steps of each first division block 562 can be a product of $N_1$ and $N_2$, i.e., $(N_1 \times N_2)$ on each side. Each of the first staircase steps 668 on each side of the second staircase structure 872 corresponds to one alternating dielectric layer pair 454 and can be connected to the respective word line 333 and the control gate of the memory cell 340 (in FIG. 3) in the subsequent processes. Therefore, a total number of $(N_1 \times N_2)$ alternating dielectric layer pairs can be electrically connected through the second staircase structure 872. By forming first staircase structures 666 with $N_1$ number of first staircase steps, the number of the second staircase steps 874 along word line (WL) direction (x-direction) can be reduced by $N_1$ times. As a result, the overall lateral dimension of the second staircase structure 872 in x-direction can be shortened.

Figure 9:
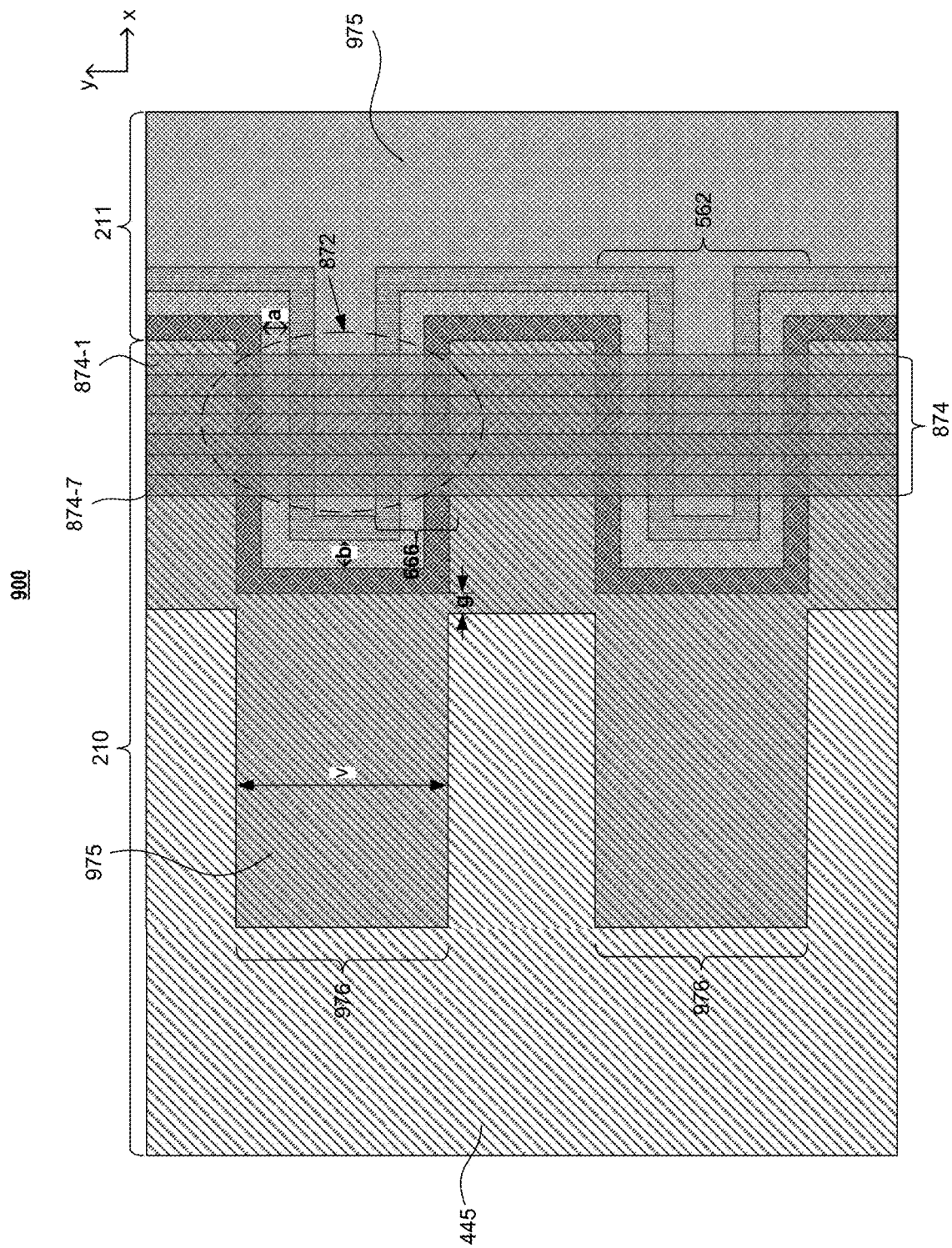
FIG. 9 illustrates a top-down view of an exemplary 3D memory structure with a third mask stack, according to some embodiments of the present disclosure.

FIG. 9 illustrates a top-down view of an exemplary structure 900 according to some embodiments. The structure 900 includes a third mask stack 975 disposed on the structure 800 (in FIG. 8). The third mask stack 975 can be formed using a similar material and a similar technique as the first mask stack 560. The third mask stack 975 covers the second staircase structures 872 and the channel structure region 211. The third mask stack 975 also covers a portion of the staircase region 210 adjacent to the second staircase structures 872. The third mask stack 975 includes a plurality of second division blocks 976 next to the first division blocks 562. The second division blocks 976 extend in x-direction into staircase region 210 and are repeated along y-direction. In FIG. 9, two second division blocks 976 are shown as an example, however, the number of the second division blocks 976 is not limited as such.

In some embodiments, each second division block 976 can be formed in-line with a corresponding first division block 562 along x-direction. In some embodiments, the structure 900 includes an offset "g" between the second division block 976 and the first division block 562, wherein the offset "g" can be adjusted according to the target structures in the subsequent processes. In some embodiments, the second division blocks 976 can include a width "v" in y-direction, different from that of the first division blocks 562.

Figure 10:
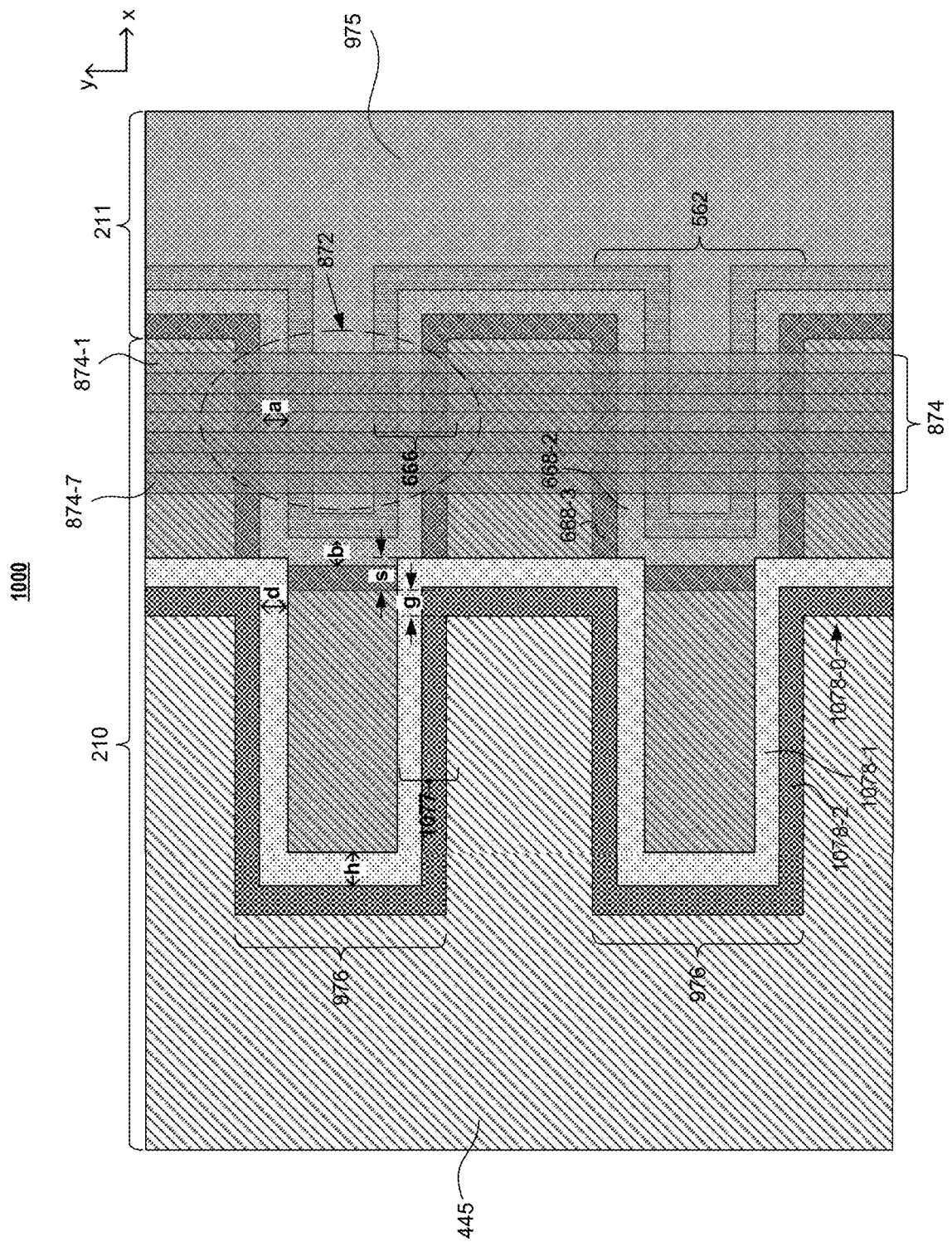
FIG. 10 illustrates a top-down view of an exemplary 3D memory structure after forming third staircase structures, according to some embodiments of the present disclosure.

FIG. 10 illustrates a top-down view of an exemplary structure 1000, according to some embodiments. The structure 1000 includes a third staircase structure 1077 on each side of each second division block 976. The third staircase structure 1077 includes a plurality of third staircase steps 1078 oriented in y-direction, for example, 1078-0, 1078-1 and 1078-2 shown in FIG. 10. The second division blocks 976 and the third staircase structure 1077 can be formed using similar techniques as the first division blocks 562 and the first staircase structure 666 using, e.g., the third mask stack 975 and a repetitive etch-trim process. In some embodiments, each third staircase step 1078 can have a width "h" in x-direction and a width "d" in y-direction. In some embodiments, each of the third staircase steps 1078 can have a different width in x or y-direction. The width "h" of the third staircase step 1078 can be the same as or different from the width "b" of the first staircase step 666. The width "d" of the third staircase step 1078 can be the same as or different from the width "a" of the first staircase step 666. In some embodiments, the width "h" and "d" can be between 10 nm and 100 nm in y-direction.

In some embodiments, the topmost level of the third staircase structure 1077 (e.g., 1078-1 in FIG. 10) can have an offset "s" from the bottommost level of the second staircase structure 872 along x-direction (e.g., 668-3 in FIG. 10). In some embodiments, the offset "s" can be a product of width "b" and the number of first staircase steps $N_1$, i.e., ($N_1 \times b$). In this example, the third staircase structure 1077 is overlapped with the second staircase structure 872, and the sum of the offset "g" and the offset "s" can be described as the total width of the third staircase structure 1077 in the x-direction, i.e., $g+s=N_3 \times h$. In some embodiments, the offset "s" can be zero. In this example, the third staircase structures 1077 is formed adjacent to the second staircase structure 872 without an overlap or a gap in the x-direction. In some embodiments, the third staircase structure 1077 can have a gap from the second staircase structure 872 in the x-direction. In this example, the distance from the topmost level of the third staircase structure 1077 to the bottommost level of the second staircase structure 872, e.g., the gap, can also be represented with a magnitude of the offset "s". In this scenario, the difference between the offset "g" and "s" is the total width of the third staircase structure 1077 in the x-direction, i.e., $g-s=N_3 \times h$. This example of the offset "s" as the gap is not shown in FIG. 10, and can be reproduced based on the description above.

In some embodiments, each of the third staircase steps can have one alternating dielectric layer pair 454. In FIG. 10, each of the third staircase structures 1077 includes three third staircase steps 1078. However, the number of the third staircase steps 1078 in each of the third staircase structures 1077 is not limited and can be any whole number $N_3$. After forming the third staircase structures 1077, the third mask stack 975 can be removed, using a similar technique as removing the first mask stack 560.

Figure 11:
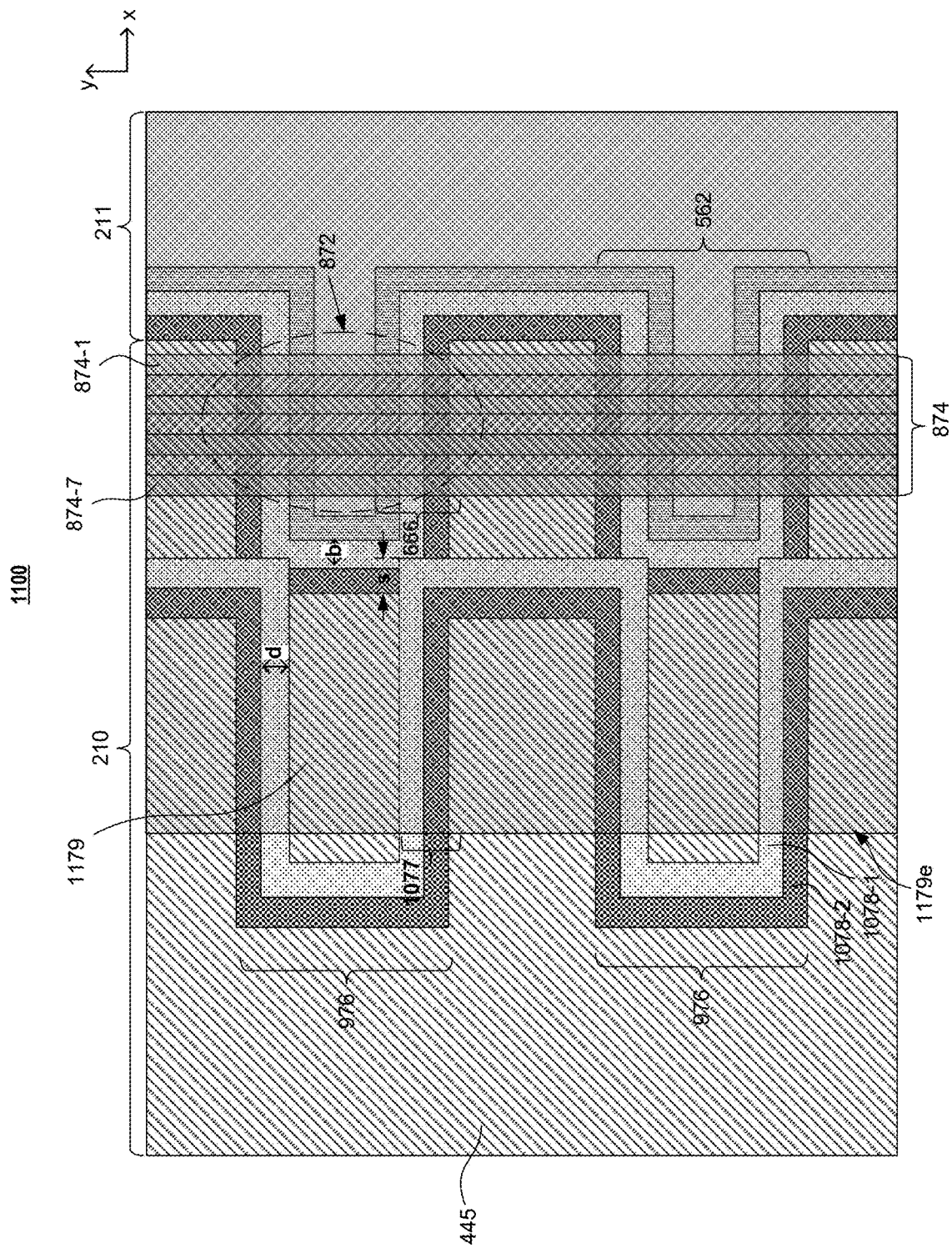
FIG. 11 illustrates a top-down view of an exemplary 3D memory structure with a fourth mask stack, according to some embodiments of the present disclosure.

FIG. 11 illustrates a top-down view of an exemplary structure 1100 of a 3D memory device, according to some embodiments. The exemplary structure 1100 includes a fourth mask stack 1179 disposed over the channel structure region 211, the second staircase structures 872 and a portion of the staircase region 210. The fourth mask stack 1179, having an edge 1179e, covers a portion of the second division blocks 976 in the x-direction, and extends along y-direction. The fourth mask stack 1179 can be made of a similar material as the first mask stack 560 and can be formed using a similar technique.

Figure 12B:
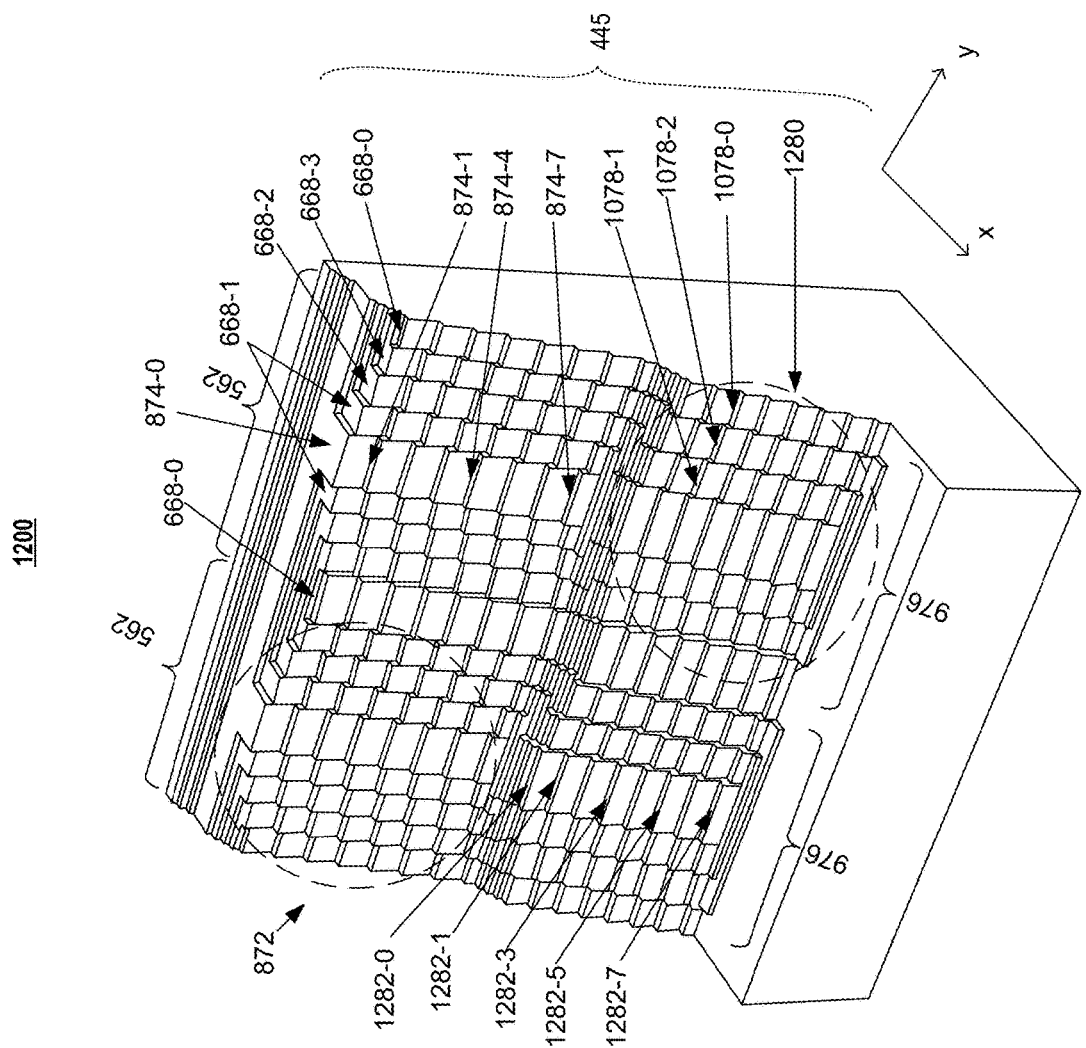

FIG. 12A illustrates a top-down view of an exemplary structure 1200 according to some embodiments. FIG. 12B illustrates a three-dimensional view of the structure 1200, according to some embodiments. The structure 1200 further includes a plurality of fourth staircase structures 1280 formed on each of the second division block 976. In some embodiments, the fourth staircase structure 1280 includes a plurality of fourth staircase steps 1282 oriented in x-direction (for example, 1282-0, 1282-1, 1282-2, . . . , and 1282-7). In some embodiments, each of the fourth staircase steps 1282 includes two third staircase structures 1077, symmetrically distributed on each side along y-direction. In FIGS. 12A and 12B, eight fourth staircase steps 1282 in x-direction are shown as illustration. However, the number of the fourth staircase steps is not limited, and can be any whole number $N_4$.

In some embodiments, the fourth staircase structure 1280 and the fourth staircase steps 1282 can be formed by using similar techniques as the second staircase structure 872 and the second staircase steps 874, e.g., with the fourth mask stack 1179 and a repetitive etch-trim process. In some embodiments, each of the third staircase structures 1077 can have three staircase steps in y-direction, while each of the third staircase steps 1078 can have one alternating dielectric layer pair 454. In this example, each of the fourth staircase steps 1282 can correspond to three alternating dielectric layer pairs 454, and can be three-level high vertically.

In some embodiments, each of the fourth staircase steps include a width "w", wherein the width "w" can be between 10 nm to 100 nm in x-direction. The dimension of the third staircase steps 1078 in the x-y plane can therefore have "w" in x-direction and "d" in y-direction. In some embodiments, each of the fourth staircase steps can have a different width. In some embodiments, the width "w" of the fourth staircase structure 1280 can be the same as or different from the width "c" of the second staircase structure 872. For a high vertical film stack, the width "w" or "d" can be formed wider than the width "c" or "a" such that the contact structures 214 (e.g., as shown in FIG. 3) on the third or fourth staircase steps can be fabricated with larger process windows. For example, deep contact holes for the contact structures 214 can be formed on the third or fourth staircase steps 1078/1282 with larger diameters or can have more tolerance for profile bowing.

In some embodiments, the fourth staircase structure 1280 can be disposed relatively to the second staircase structure 872 with an offset "t". The offset "t" is a dimension between two adjacent staircase steps, one from the fourth staircase structure 1280 and the other from the second staircase structure 872. The offset "t" can be between zero to 1 μm in x-direction. In a vertical direction or z-direction, i.e., perpendicular to the top surface of the substrate, the offset "t" can be at least one level or one layer of the alternating dielectric layer pair 454.

In some embodiments, the fourth staircase structure 1280 (also referred to as a lower staircase structure) includes $N_4$ number of fourth staircase steps 1282 in x-direction (also referred to as a first direction). Each of the fourth staircase steps 1282 can correspond to $N_3$ number of the third staircase steps 1078 in y-direction (also referred to as a second direction) on each side. In this example, the total number of staircase steps of the fourth staircase structure 1280 for each of the second division blocks 976 can be a product of N4 and N3, e.g., (N4×N3). Together with the second staircase structure 872 (also referred to as an upper staircase structure), the total number of staircase steps can be N4×N3+N2×N1. Therefore, by applying first and second division blocks 562/976 and by forming the first and third staircase structures 666/1077, the number of staircase steps oriented in x-direction (e.g., the second and the fourth staircase steps 874/1282) can be greatly reduced and the overall lateral dimension of the staircase structure (e.g., the second and the fourth staircase structures 872/1280) in x-direction can also be greatly reduced. In addition, separating upper and lower levels of staircase structures and applying separate etch-trim processes, staircase steps with different dimensions can be formed to accommodate processing challenges for a 3D memory with a high vertical word-line stack.

In some embodiments, more division blocks and staircase structures can be formed next in the staircase region 210, adjacent to the second division blocks 976, to form more staircase steps for stacked word lines or control gates of memory cells. Similar structure and method as described above can be used.

Fabrication of the 3D memory can be resumed after forming the staircase structures with multiple divisions, for example, forming channel holes, slit structures, replacement gates, and contact structures. Related processes and techniques for these subsequent structures are known to a person skilled in the art and therefore are not included in the present disclosure.

Figure 13:
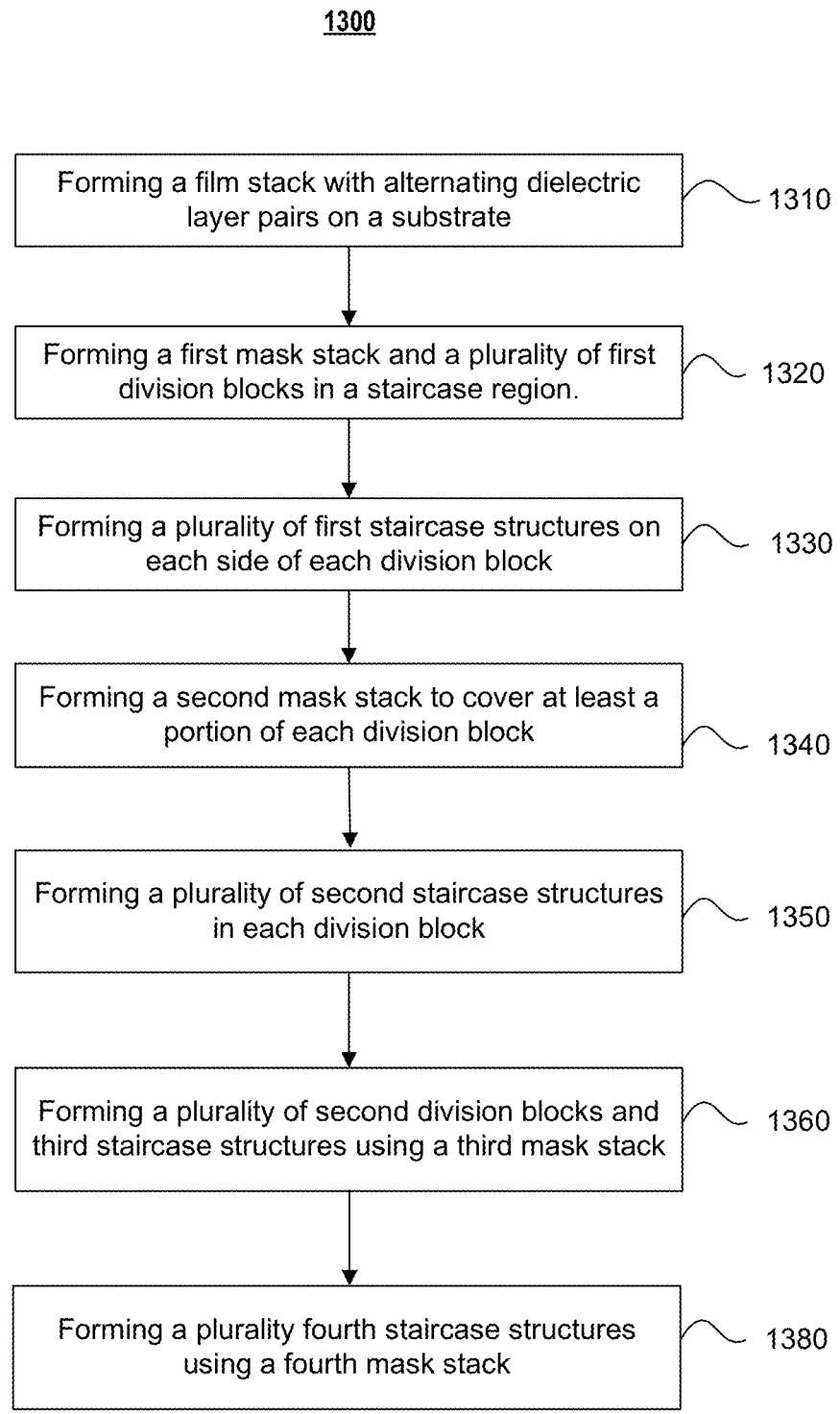
FIG. 13 illustrates a flow diagram of an exemplary method for forming a 3D memory structure, according to some embodiments of the present disclosure.

FIG. 13 illustrates an exemplary method 1300 for forming staircase structures with multiple divisions for a three-dimensional (3D) memory, according to some embodiments. The process steps of the method 1300 can be used to form memory device structures illustrated in FIGS. 4-5, 6A-6B, 7, 8A-8B, 9-11, 12A-12B and 13. The process steps shown in method 1300 are not exhaustive and other process steps can be performed as well before, after, or between any of the illustrated process steps. In some embodiments, some process steps of exemplary method 1300 can be omitted or include other process steps that are not described here for simplicity. In some embodiments, process steps of method 1300 can be performed in a different order and/or vary.

At process step 1310, a film stack is disposed on a substrate. The film stack can be the film stack 445 in FIG. 4, with alternating dielectric (first dielectric) and sacrificial (second dielectric) layers. The dielectric and sacrificial layers are similar to the dielectric layer 450 and the sacrificial layer 452 in FIG. 4 and can be disposed using a similar technique. The dielectric layer and the sacrificial layer underneath are called an alternating dielectric layer pair.

At process step 1320, a first mask stack is disposed on the film stack in a channel structure region and a portion of a staircase region. The first mask stack can be the first mask stack 560 shown in FIG. 5, and can be made from similar materials. The first mask stack includes a plurality of first division blocks in the staircase region. Each of the division blocks extends in x-direction parallel to word lines or control gates of the 3D memory, and can be repeated along y-direction (perpendicular to x-direction) on a two dimensional plane (x-y plane) parallel to the substrate.

At process step 1330, a first staircase structure is formed on each side of each first division block. The first staircase structure is similar to the first staircase structure 666 in FIGS. 6A and 6B, and can be formed using a similar repetitive etch-trim process. In some embodiments, each first staircase structure includes $N_1$ number of first staircase steps oriented in y-directions. In some embodiments, each first staircase step includes one alternating dielectric layer pair.

At process step 1340, a second mask stack is disposed on the first division blocks. The second mask stack can be the second mask stack 770 shown in FIG. 7. The second mask stack can extend in y-direction and can cover at least a portion of the first division blocks.

At process step 1350, a plurality of second staircase structures are formed in each division block, where the second staircase structure includes $N_2$ number of second staircase steps oriented in x-direction. In some embodiments, each of the second staircase steps includes $N_1$ number of the first staircase steps on each side along y-directions. The second staircase structure can be the second staircase structure 872 in FIGS. 8A and 8B, and can be formed using a similar repetitive etch-trim process.

At process step 1360, a plurality of third staircase structures are formed on each side of second division blocks using a third mask stack, as shown in FIGS. 9 and 10. The third staircase structures can be formed using similar techniques as the third staircase structure 1077, such as repetitive etch-trim processes. Each of the third staircase structures include $N_3$ number of the third staircase steps in y-direction. The second division blocks are located in the staircase region next to the first division blocks, with an offset "s" in x-direction, wherein the offset "s" can be in a range from 0 to 1 μm.

At process step 1380, a plurality of fourth staircase structures are formed in each of second division blocks, similar to the fourth staircase structures 1280 using a fourth mask stack 1179, as shown in FIGS. 11, 12A and 12B. The fourth staircase structures can be formed using similar techniques as described above, such as repetitive etch-trim processes. The fourth staircase structure can include $N_4$ number of fourth staircase steps in x-direction, where each of the fourth staircase steps corresponds to $N_3$ number of the third staircase steps in y-direction.

By completing process step 1380, the total number of staircase steps in each division block can be $N_1 \times N_2 + N_3 \times N_4$, corresponding to $N_1 \times N_2 + N_3 \times N_4$ number of alternating dielectric layer pairs. More division blocks and staircase structures can be formed in the staircase region using similar method. By implementing division blocks laterally and vertically, the number of staircase steps in x-direction (parallel to the word lines) can be greatly reduced. In the meantime, the lateral dimension of an overall staircase structures in x-direction can also be greatly reduced. In addition to shrinking dimensions, multiple divisions enable staircase structures having different dimensions, which can be designed according to process requirements. Therefore, staircase structures with multiple divisions can provide larger process window and potentially increase manufacturing yield.

Various embodiments in accordance with the present disclosure provide a 3D memory device with smaller die size, higher device density, and improved performance compared with other 3D memory devices.

Accordingly, various embodiments of three-dimensional memory device and methods of making the same are described in the present disclosure.

In some embodiments, staircase structures of a three-dimensional memory device and fabrication method thereof are disclosed. The semiconductor structure includes a first and a second film stacks, wherein the first film stack is disposed over the second film stack and has $M_1$ number of layers. The second film stack has $M_2$ number of layers. $M_1$ and $M_2$ are whole numbers. The semiconductor structure also includes an upper staircase structure and a lower staircase structure, wherein the upper staircase structure is formed in the first film stack and the lower staircase structure is formed in the second film stack. The upper and lower staircase structures are next to each other with an offset.

In some embodiments, a method for forming a three-dimensional memory structure includes forming a film stack with a plurality of layers on a substrate. The method also includes forming an upper staircase structure with $L_1$ number of steps in a first direction, wherein each step of the upper staircase structure in the first direction includes $L_2$ number of steps in a second direction. $L_1$ and $L_2$ are whole numbers, and the first and second directions are perpendicular to each other and are on a plane parallel to a top surface of the substrate. The method further includes forming a lower staircase structure with $L_3$ number of steps in the first direction, wherein each step of the lower staircase structure in the first direction has $L_4$ number of steps in the second direction. $L_3$ and $L_4$ are whole numbers, and the lower staircase structure is located next to the upper staircase structure with an offset.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor structure, comprising:
   forming a film stack with a plurality of layers on a substrate;
   forming an upper staircase structure with $L_1$ number of steps in a first direction, wherein:
      each step of the upper staircase structure in the first direction corresponds to $L_2$ number of steps in a second direction;
      $L_1$ and $L_2$ are whole numbers; and
      the first and second directions are perpendicular to each other and are on a plane parallel to a top surface of the substrate, and
   forming a lower staircase structure with $L_3$ number of steps in the first direction, wherein:
      each step of the lower staircase structure in the first direction corresponds to $L_4$ number of steps in the second direction;
      $L_3$ and $L_4$ are whole numbers; and
      the lower staircase structure is located next to the upper staircase structure with an offset;
   disposing a first mask stack with a first division block on the film stack;
   forming a first staircase structure on each side of the first division block;
   disposing a second mask stack covering a portion of the first division block; and
   forming the upper staircase structure using the second mask stack.

2. The method of claim 1, wherein the forming the first staircase structure on each side of the first division block, comprises:
   etching one layer of the film stack;
   trimming the first mask stack in the second direction; and
   repeating the etching and the trimming for $L_2$ times to form $L_2$ number of steps in the second direction.

3. The method of claim 1, wherein the forming the upper staircase structure using the second mask stack, comprises:
   etching $L_2+1$ number of layers of the film stack;
   trimming the second mask stack in the first direction; and
   repeating the etching and the trimming for $L_1$ times to form $L_1$ number of steps in the first direction.

4. The method of claim 1, wherein:
   each layer of the film stack comprises a first dielectric layer and a second dielectric layer; and
   the first and second dielectric layers are arranged alternatingly on the substrate.

5. The method of claim 1, wherein:
   each layer of the film stack comprises a dielectric layer and a conductive layer; and
   the dielectric and conductive layers are arranged alternatingly on the substrate.

6. The method of claim 1, wherein:
   the upper staircase structure comprises a first number of layers no less than a product of $L_1$ and $L_2$; and
   the lower staircase structure comprises a second number of layers no less than a product of $L_3$ and $L_4$.

7. A method for forming a semiconductor structure, comprising:
   forming a film stack with a plurality of layers on a substrate;
   forming an upper staircase structure with $L_1$ number of steps in a first direction, wherein:
      each step of the upper staircase structure in the first direction corresponds to $L_2$ number of steps in a second direction;
      $L_1$ and $L_2$ are whole numbers; and
      the first and second directions are perpendicular to each other and are on a plane parallel to a top surface of the substrate,
   forming a lower staircase structure with $L_3$ number of steps in the first direction, wherein:
      each step of the lower staircase structure in the first direction corresponds to $L_4$ number of steps in the second direction;
      $L_3$ and $L_4$ are whole numbers; and
   the lower staircase structure is located next to the upper staircase structure with an offset;
   disposing a third mask stack with a second division block, wherein the third mask stack covers the upper staircase structure;
   forming a third staircase structure on each side of the second division block;
   disposing a fourth mask stack covering the upper staircase structure and a portion of the second division block; and
   forming the lower staircase structure using the fourth mask stack.

8. The method of claim 7, wherein the forming the third staircase structure on each side of the second division block, comprises:
   etching one layer of the film stack;
   trimming the third mask stack in the second direction; and
   repeating the etching and the trimming for $L_4$ times to form $L_4$ number of steps in the second direction.

9. The method of claim 7, wherein the forming the lower staircase structure using the fourth mask stack, comprises:
etching $L_4+1$ number of layers of the film stack;
trimming the fourth mask stack in the first direction; and
repeating the etching and the trimming for $L_3$ times to form $L_3$ number of steps in the first direction.

10. A method for forming a three-dimensional memory device, comprising:
disposing a film stack extending parallel to a substrate in a first direction and a second direction perpendicular to the first direction, wherein the film stack comprises alternating dielectric layer pairs;
forming, in the second direction, $L_2$ number of first staircase steps on each side of a first division block, wherein the first division block extends in the first direction;
forming, in the first direction, $L_1$ number of second staircase steps, wherein the $L_2$ number of first staircase steps are formed in the second direction on each side of each second staircase step;
forming, in the second direction, $L_4$ number of third staircase steps on each side of a second division block, wherein the second division block extends in the first direction with an offset from the first division block; and
forming, in the first direction, $L_3$ number of fourth staircase steps, wherein the $L_4$ number of third staircase steps are formed in the second direction on each side of each fourth staircase step.

11. The method of claim 10, wherein the forming in the second direction the $L_2$ number of first staircase steps on each side of the first division block comprises:
disposing a first mask stack on the film stack, wherein the first mask stack comprises the first division block and extends in the second direction.

12. The method of claim 11, wherein the forming in the second direction the $L_2$ number of first staircase steps on each side of the first division block further comprises:
etching one alternating dielectric layer pair of the film stack;
trimming the first mask stack in the second direction; and
repeating the etching and the trimming for $L_2$ times.

13. The method of claim 10, wherein the forming in the first direction the $L_1$ number of second staircase steps comprises:
disposing a second mask stack on the film stack, wherein the second mask stack covers a portion of the first division block in the first direction and extends in the second direction.

14. The method of claim 13, wherein the forming in the first direction the $L_1$ number of second staircase steps further comprises:
etching $L_2+1$ number of alternating dielectric layer pairs of the film stack;
trimming the second mask stack in the first direction; and
repeating the etching and trimming for $L_1$ times.

15. The method of claim 10, wherein the forming in the second direction the $L_4$ number of third staircase steps comprises:
disposing a third mask stack on the film stack, wherein the third mask stack, comprising the second division block, extends in the second direction and covers the $L_1$ number of second staircase steps.

16. The method of claim 15, wherein the forming in the second direction the $L_4$ number of third staircase steps further comprises:
etching one alternating dielectric layer pair of the film stack;
trimming the third mask stack in the second direction; and
repeating the etching and trimming for $L_4$ times.

17. The method of claim 10, wherein the forming in the first direction the $L_3$ number of fourth staircase steps comprises:
disposing a fourth mask stack on the film stack, wherein the fourth mask stack extends in the second direction and covers the $L_1$ number of second staircase steps and a portion of the second division block in the first direction.

18. The method of claim 17, wherein the forming in the first direction the $L_3$ number of fourth staircase steps further comprises:
etching $L_4+1$ number of alternating dielectric layer pairs of the film stack;
trimming the fourth mask stack in the first direction; and
repeating the etching and trimming for $L_3$ times.

19. The method of claim 10, wherein the disposing the film stack comprises disposing a first dielectric layer and a second dielectric layer alternatingly on the substrate, each alternating dielectric layer pair comprising one pair of the first dielectric layer and the second dielectric layer.

* * * * *